United States Patent
Chung et al.

(10) Patent No.: US 11,238,811 B2
(45) Date of Patent: Feb. 1, 2022

(54) STAGE WITH MULTIPLE OUTPUT BUFFERS AND SCAN DRIVER HAVING THE SAME

(71) Applicant: Samsung Display Co., Ltd., Yongin-si (KR)

(72) Inventors: Bo Yong Chung, Yongin-si (KR); Tak Young Lee, Yongin-si (KR); Sang Uk Lim, Yongin-si (KR)

(73) Assignee: Samsung Display Co, Ltd., Yongin-si (KR)

( * ) Notice: Subject to any disclaimer, the term of this patent is extended or adjusted under 35 U.S.C. 154(b) by 0 days.

(21) Appl. No.: 16/935,303

(22) Filed: Jul. 22, 2020

(65) Prior Publication Data

US 2021/0056910 A1  Feb. 25, 2021

(30) Foreign Application Priority Data

Aug. 22, 2019  (KR) .......................... 10-2019-0103009

(51) Int. Cl.
*G09G 3/3266* (2016.01)
*G09G 3/3275* (2016.01)
*G09G 3/3258* (2016.01)

(52) U.S. Cl.
CPC ......... *G09G 3/3266* (2013.01); *G09G 3/3258* (2013.01); *G09G 3/3275* (2013.01); *G09G 2310/0291* (2013.01)

(58) Field of Classification Search
CPC ....................................................... G09G 3/3266
USPC ............................................................ 345/76
See application file for complete search history.

(56) References Cited

U.S. PATENT DOCUMENTS

| 2018/0190204 | A1  | 7/2018 | Shin et al. | |
| 2019/0103049 | A1* | 4/2019 | Noh ...................... | H03K 17/162 |
| 2019/0130842 | A1* | 5/2019 | Jang ...................... | G09G 3/3233 |
| 2019/0164498 | A1* | 5/2019 | Jang ...................... | G09G 3/3266 |

* cited by examiner

*Primary Examiner* — Long D Pham
(74) *Attorney, Agent, or Firm* — H.C. Park & Associates, PLC

(57) ABSTRACT

A stage and a scan driver having the same. The stage outputs a scan signal and a sensing signal to a scan line and a sensing line, respectively. The stage includes a first controller configured to control a voltage of a sensing node and a driving node based on first to third control signals and a carry signal of the stage and another stage connected to the stage, a second controller configured to control a voltage of an inversion driving node based on a first carry clock signal, the voltage of the driving node, and the third control signal, and a first output buffer configured to output a second carry clock signal or a second low potential power as the carry signal in correspondence with the voltage of the driving node and the inversion driving node.

19 Claims, 11 Drawing Sheets

STAGE WITH MULTIPLE OUTPUT BUFFERS AND SCAN DRIVER HAVING THE SAME

This application claims priority from and the benefit of Korean Patent Application No. 10-2019-0103009, filed on Aug. 22, 2019, which is hereby incorporated by reference for all purposes as if fully set forth herein.

BACKGROUND

Field

Exemplary embodiments of the invention relate generally to a stage and a scan driver having the same.

Discussion of the Background

A display device typically includes a pixel unit including a plurality of pixels, a scan driver, a data driver, a timing driver, and the like. The scan driver includes stages connected to scan lines, and the stages supply scan signals to the scan lines connected to the stages in correspondence with signals from the timing controller.

In recent years, a display device has typically performed driving that compensates for deterioration or a characteristic change of a driving transistor outside a pixel circuit by sensing a threshold voltage or a mobility of a driving transistor included in a pixel circuit. To this end, a scan driver may be configured to further supply a sensing signal through a sensing line.

At this time, the scan driver controls an output of the scan signal and the sensing signal by controlling on/off of transistors provided in the stages to charge or discharge a voltage of specific nodes. Some of the transistors are provided to configure an inverter for control of the node voltage, and some of the transistors for operating as the inverter are required to be always maintained in a turned-on state.

When a specific transistor is always maintained in the turned-on state during driving of the display device, a constant current may flow in a peripheral transistor, and a characteristic of a corresponding transistor may be deteriorated.

The above information disclosed in this Background section is only for understanding of the background of the inventive concepts, and, therefore, it may contain information that does not constitute prior art.

SUMMARY

Devices constructed according to exemplary embodiments of the invention are capable of providing a stage that does not include an inverter and a scan driver including the stage.

Devices constructed according to exemplary embodiments of the invention are further capable of providing a stage does not include a dummy circuit and has a reduced number of transistors and capacitors, and a scan driver including the stage.

Additional features of the inventive concepts will be set forth in the description which follows, and in part will be apparent from the description, or may be learned by practice of the inventive concepts.

A stage according to an embodiment of the inventive concepts may output a scan signal and a sensing signal to a scan line and a sensing line, respectively. The stage may include a first controller configured to control a voltage of a sensing node and a voltage of a driving node based on first to third control signals and a carry signal of the stage and another stage connected to the stage, a second controller configured to control a voltage of an inversion driving node based on a first carry clock signal, the voltage of the driving node, and the third control signal, a first output buffer configured to output a second carry clock signal or a second low potential power as the carry signal in correspondence with the voltage of the driving node and the inversion driving node, a second output buffer configured to output a scan clock signal or a first low potential power as the scan signal in correspondence with the voltage of the driving node and the inversion driving node, and a third output buffer configured to output a sensing clock signal or the first low potential power as the sensing signal in correspondence with the voltage of the driving node and the inversion driving node.

According to an embodiment, the first controller may include a first transistor connected between a first input terminal receiving a scan start signal or a carry signal of a previous stage connected to the stage and the driving node, and having a gate electrode connected to the first input terminal, a second transistor and a third transistor connected in series between a third power input terminal receiving high potential power and the driving node, and having gate electrodes connected to the sensing node and a second control signal input terminal receiving the second control signal, respectively, a fourth transistor connected between the second power input terminal receiving the first low potential power and the driving node, and having a gate electrode connected to a third control signal input terminal receiving the third control signal, a sixth transistor connected between a first output terminal outputting the carry signal and the sensing node, and having a gate electrode connected to a first control signal input terminal receiving the first control signal, an eighth transistor connected between the driving node and a second power input terminal receiving the second low potential power, and having a gate electrode receiving a carry signal of a next stage connected to the stage, and a first capacitor connected between the third power input terminal and the sensing node.

According to an embodiment, when the scan start signal or the carry signal of the previous stage is input, the first transistor may be turned on to transfer the scan start signal or the carry signal of the previous stage to the driving node, and the driving node may be set to a gate on voltage by the scan start signal or the carry signal of the previous stage.

According to an embodiment, when the third control signal is input, the fourth transistor may be turned on to transfer the second low potential power to the driving node, and the driving node may be set to a gate off voltage by the first low potential power.

According to an embodiment, when the first control signal is input during a driving period in one frame, the sixth transistor may be turned on to transfer the carry signal to the sensing node, the sensing node may be set to a gate on voltage by the carry signal, and the second transistor may be turned on as the sensing node is set to the gate on voltage.

According to an embodiment, when the second control signal is input during a sensing period in the one frame, the third transistor may be turned on to transfer the high potential power transferred through the second transistor to the driving node, and the driving node may be set to a gate on voltage by the high potential power.

According to an embodiment, when the carry signal of the next stage is input during a driving period in one frame, the eighth transistor may be turned on to transfer the second low potential power to the driving node, and the driving node may be set to a gate off voltage by the second low potential power.

According to an embodiment, the first transistor may include a (1_1)-th transistor and a (1_2)-th transistor connected in series between the first input terminal and the driving node, and having a gate electrode connected to the first input terminal, the third transistor may include a (3_1)-th transistor and a (3_2)-th transistor connected in series between the second transistor and the driving node, and having a gate electrode connected to the second control signal input terminal, the fourth transistor may include a (4_1)-th transistor and a (4_2)-th transistor connected in series between the second power input terminal and the driving node, and having a gate electrode connected to the third control signal input terminal, the sixth transistor may include a (6_1)-th transistor and a (6_2)-th transistor connected in series between the first output terminal and the sensing node, and having a gate electrode connected to the first control signal input terminal, and the eighth transistor may include an (8_1)-th transistor and an (8_2)-th transistor connected in series between the driving node and the second power input terminal, and having a gate electrode receiving the carry signal of the next stage through.

According to an embodiment, the first controller may include a fifth transistor connected between a common node of the (6_1)-th transistor and the (6_2)-th transistor and the third power input terminal, and having a gate electrode connected to the sensing node, and a seventh transistor having one electrode connected to the third power input terminal, the other electrode connected to a common node of the (1_1)-th transistor and the (1_2)-th transistor, a common node of the (3_1)-th transistor and the (3_2)-th transistor, a common node of the (4_1)-th transistor and the (4_2)-th transistor, and a common node of the (8_1)-th transistor and the (8_2)-th transistor, and a gate electrode connected to the driving node.

According to an embodiment, the second controller may include a ninth transistor connected between a first carry clock input terminal receiving the first carry clock signal and the inversion driving node, and having a gate electrode connected to the driving node, an eleventh transistor connected between the inversion driving node and a third power input terminal receiving high potential power, and having a gate electrode connected to a third control signal input terminal receiving the third control signal, and a twelfth transistor connected between the inversion driving node and the third power input terminal, and having a gate electrode connected to the first carry clock input terminal.

According to an embodiment, when the driving node is set to a gate on voltage, the ninth transistor may be turned on to transfer the first carry clock signal to the inversion driving node.

According to an embodiment, when the third control signal is input, the eleventh transistor may be turned on to transfer the high potential power to the inversion driving node, and the inversion driving node may be set to a gate on voltage of the high potential power.

According to an embodiment, when the first carry clock signal is input, the twelfth transistor may be turned on to transfer the high potential power to the inversion driving node, and the inversion driving node may be set to a gate on voltage of the high potential power.

According to an embodiment, the ninth transistor may include a (9_1)-th transistor and a (9_2)-th transistor connected in series between the first carry clock input terminal and the inversion driving node, and having a gate electrode connected to the driving node, and the stage may further include a tenth transistor connected between a common node of the (9_1)-th transistor and the (9_2)-th transistor and the third power input terminal, and having a gate electrode connected to the inversion driving node.

According to an embodiment, the stage may further include a third controller configured to transfer the second low potential power to the driving node when the second carry clock signal is input while the inversion driving node is set to a gate on voltage.

According to an embodiment, the third controller may include a nineteenth transistor and a twentieth transistor connected in series between the driving node and a first output terminal outputting the carry signal, and having gate electrodes connected to a second carry clock input terminal receiving the second carry clock signal and the inversion driving node, respectively.

According to an embodiment, the third controller may include a nineteenth transistor and a twentieth transistor connected in series between the driving node and a second power input terminal receiving the second low potential power, and having gate electrodes connected to a second carry clock input terminal receiving the second carry clock signal and the inversion driving node, respectively.

A scan driver according to an embodiment of the inventive concepts may include stages that output scan signals and sensing signals to scan lines and sensing lines. Each of the stages may include a first controller configured to control a voltage of a sensing node and a voltage of a driving node based on first to third control signals and a carry signal of the stage and another stage connected to the stage, a second controller configured to control a voltage of an inversion driving node based on a first carry clock signal, the voltage of the driving node, and the third control signal, a first output buffer configured to output a second carry clock signal or a second low potential power as the carry signal in correspondence with the voltage of the driving node and the inversion driving node, a second output buffer configured to output a scan clock signal or a first low potential power as the scan signal in correspondence with the voltage of the driving node and the inversion driving node, and a third output buffer configured to output a sensing clock signal or the first low potential power as the sensing signal in correspondence with the voltage of the driving node and the inversion driving node.

According to an embodiment, the first controller may include a first transistor connected between a first input terminal receiving a scan start signal or a carry signal of a previous stage connected to the stage and the driving node, and having a gate electrode connected to the first input terminal, a second transistor and a third transistor connected in series between a third power input terminal receiving high potential power and the driving node, and having gate electrodes connected to the sensing node and a second control signal input terminal receiving the second control signal, respectively, a fourth transistor connected between a second power input terminal receiving the second low potential power and the driving node, and having a gate electrode connected to a third control signal input terminal receiving the third control signal, a sixth transistor connected between a first output terminal outputting the carry signal and the sensing node, and having a gate electrode connected to a first control signal input terminal receiving the first control signal, an eighth transistor connected between the driving node and the second power input terminal receiving the second low potential power, and having a gate electrode receiving a carry signal of a next stage connected to the stage, and a first capacitor connected between the third power input terminal and the sensing node.

According to an embodiment, the second controller may include a ninth transistor connected between a first carry clock input terminal receiving the first carry clock signal and the inversion driving node, and having a gate electrode connected to the driving node, an eleventh transistor connected between the inversion driving node and a third power input terminal receiving high potential power, and having a gate electrode connected to a third control signal input terminal receiving the third control signal, and a twelfth transistor connected between the inversion driving node and the third power input terminal, and having a gate electrode connected to the first carry clock input terminal.

The stage and the scan driver having the same according to the embodiments of the inventive concepts do not include an inverter, and thus, eliminates a transistor that is required to be always maintained in a turned-on state. Therefore, constant current occurrence may be prevented and power consumption may be reduced.

In addition, the stage and the scan driver having the same according to the embodiments of the inventive concepts do not require a dummy circuit required in a circuit in which an inverter is provided, thereby increasing space utilization efficiency.

In addition, the stage and the scan driver having the same according to the embodiments of the inventive concepts may reduce a size and a manufacturing cost by minimizing the number of transistors and capacitances.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
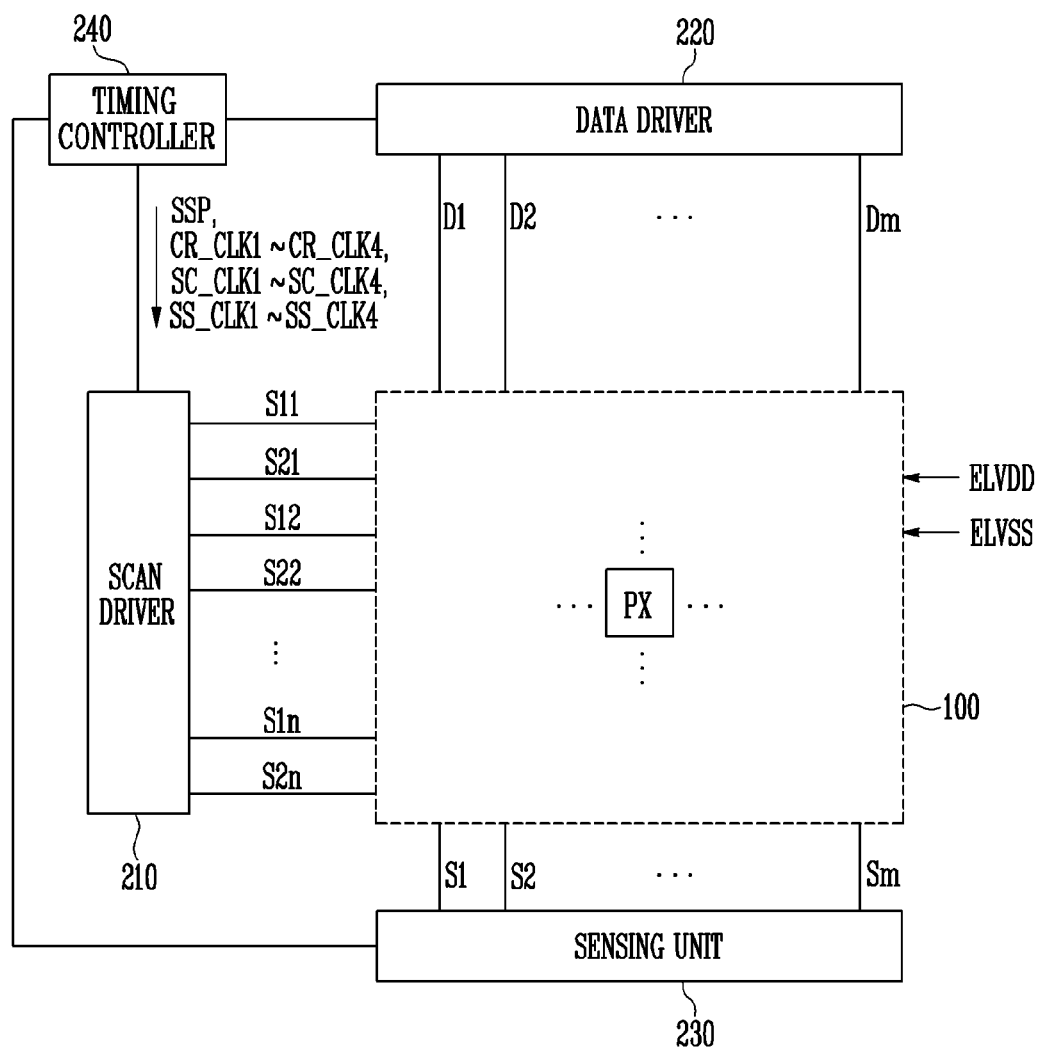
FIG. 1 is a block diagram illustrating a display device according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "connected to" or "coupled to" another element, it may be directly connected to, or coupled to the other element or intervening elements may be present. When, however, an element is referred to as being "directly connected to" or "directly coupled to" another element, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating a display device according to an embodiment of the inventive concepts.

Referring to FIG. 1, the display device according to an embodiment of the inventive concepts may include a display unit 100 including a plurality of pixels PX, a scan driver 210, a data driver 220, a sensing unit 230, and a timing controller 240.

The timing controller 240 may generate a scan driving control signal and a data driving control signal based on signals input from the outside. The scan driving control signal generated by the timing controller 240 may be supplied to the scan driver 210 and the data driving control signal may be supplied to the data driver 220.

The scan driving control signal may include a plurality of clock signals CR_CLK1 to CR_CLK4, SC_CLK1 to SC_CLK4, and SS_CLK1 to SS_CLK4 and a scan start signal SSP. The scan start signal SSP may control an output timing of a first scan signal.

The plurality of clock signals CR_CLK1 to CR_CLK4, SC_CLK1 to SC_CLK4, and SS_CLK1 to SS_CLK4 supplied to the scan driver 210 may include first to fourth carry clock signals CR_CLK1 to CR_CLK4, first to fourth scan clock signals SC_CLK1 to SC_CLK4, and first to fourth sensing clock signals SS_CLK1 to SS_CLK4.

The first to fourth carry clock signals CR_CLK1 to CR_CLK4 may be used to shift the scan start signal SSP and output the shifted scan start signal as a carry signal. The first to fourth scan clock signals SC_CLK1 to SC_CLK4 may be used to output a scan signal in correspondence with the scan start signal SSP. The first to fourth sensing clock signals SS_CLK1 to SS_CLK4 may be used to output a sensing signal in correspondence with the scan start signal SSP. In various embodiments, the timing controller 240 may further provide various clock signals required for driving the scan driver 210 in addition to the above-described clock signals CR_CLK1 to CR_CLK4, SC_CLK1 to SC_CLK4, and SS_CLK1 to SS_CLK4.

The data driving control signal may include a source start pulse and clock signals. The source start pulse may control a sampling start time of data, and the clock signals may be used to control a sampling operation.

The scan driver 210 may output the scan signal and the sensing signal in correspondence with the scan driving control signal. The scan driver 210 may supply the scan signal to first scan lines S11 to S1n. The scan signal may be sequentially or simultaneously applied to the first scan lines S11 to S1n.

The scan signal may be a square wave signal in which a gate on voltage (for example, a low level voltage for P-type transistors and a high level voltage for N-type transistors) for turning on transistors included in a pixels PX and a gate off voltage (for example, a high level voltage for the P-type transistors and a low level voltage for the N-type transistors) for turning off the transistors included in the pixels PX repeat. In the following embodiments, "a signal of a gate on voltage is applied." may be expressed as "a signal is supplied." or "supply of a signal is started.", and "a signal of a gate off voltage is applied." may be expressed as "a signal is not supplied." or "supply of a signal is stopped (or ended)."

The scan driver 210 may be a square wave signal in which a gate on voltage (for example, a low level voltage for P-type transistors and a high level voltage for N-type transistors) for turning on the transistors included in the pixels PX and a gate off voltage (for example, a high level voltage for the P-type transistors and a low level voltage for the N-type transistors) for turning off the transistors included in the pixels PX repeat.

The data driver 220 may supply data signals to data lines D1 to Dm in correspondence with the data driving control signal. The data signals supplied to the data lines D1 to Dm may be applied to the pixels PX of a pixel column selected by the scan signal. To this end, the data driver 220 may supply the data signals to the data lines D1 to Dm to be synchronized with the scan signal.

The data driver 220 may apply data signals corresponding to image data provided from the outside to the data lines D1 to Dm during a driving period in one frame. In addition, the data driver 220 may apply a sensing voltage to the data lines D1 to Dm to sense the pixels PX during a sensing period in one frame. According to various embodiments, the sensing voltage may be a black grayscale voltage capable of turning off a driving transistor provided in the pixel PX and/or a reference voltage capable of turning on the driving transistor, but the inventive concepts are not limited thereto.

The sensing unit 230 may measure state information of the pixels PX based on a current and/or a voltage fed back through sensing lines S1 to Sm. Here, the pixels PX of which the state information is measured through the sensing unit 230 may be pixels PX of a pixel column to which the sensing signal is supplied.

Deterioration information is characteristic of the driving transistor provided in the pixel PX and may include a threshold voltage, mobility information, and the like of the driving transistor. In addition, the deterioration information may include information on a characteristic of a light emitting element provided in the pixel PX.

Although the sensing unit 230 is shown as a separate configuration in FIG. 1, the sensing unit 230 may be included in another configuration element such as the data driver 220 or the timing controller 240.

The display unit 100 may include a plurality of pixels PX connected to the data lines D1 to Dm, the first scan lines S11 to S1n, the second scan lines S21 to S2n, and the sensing lines S1 to Sm. A plurality of first scan lines S11 to S1n may be connected to the pixel PX in correspondence with a circuit structure of the pixel PX.

The pixels PX may receive first driving power ELVDD and second driving power ELVSS from the outside. The first driving power ELVDD may be set to be a voltage higher than that of the second driving power ELVSS. In various embodiments of the inventive concepts, the voltage of the first driving power ELVDD in the sensing period of one frame may be set to be lower than the voltage in the driving period. However, the inventive concepts are not limited thereto.

Each of the pixels PX may receive the data signal from a corresponding data line when the scan signal is supplied through a corresponding first scan line during the driving period. The pixel PX receiving the data signal may control an amount of a current flowing from the first driving power ELVDD to the second driving power ELVSS through a light emitting element (not shown) in correspondence with the data signal. At this time, the light emitting element may generate light of a predetermined luminance in correspondence with the amount of the current.

In addition, each of the pixels PX may output a current and/or a voltage to the sensing line based on the data signal supplied to the corresponding data line when the sensing signal is supplied through a corresponding second scan line during the sensing period. The data signal supplied to the data lines D1 to Dm during the sensing period may correspond to the sensing voltage for sensing the pixel PX.

Hereinafter, the circuit structure of the pixel PX shown in FIG. 1 and a method of displaying an image by driving the pixel PX will be described in detail.

Figure 2:
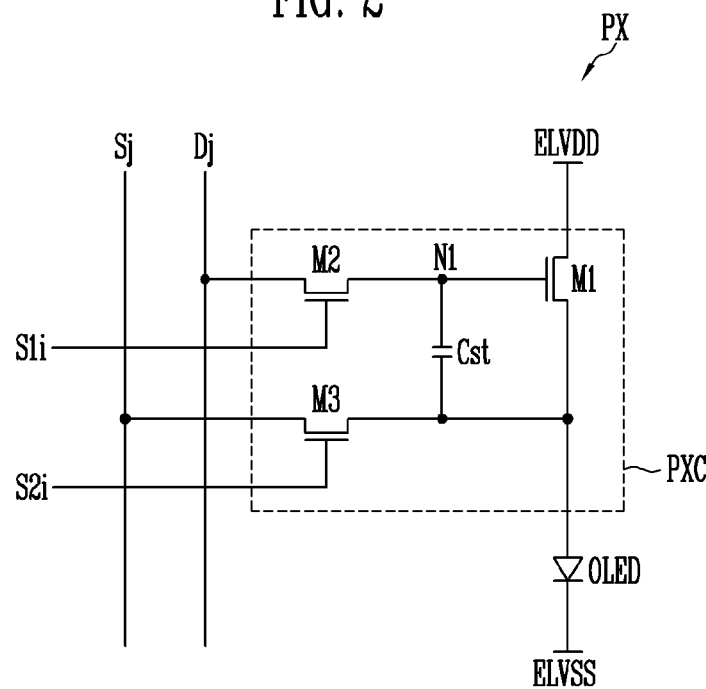
FIG. 2 is a circuit diagram illustrating an example of a pixel included in the display device of FIG. 1.

FIG. 2 is a circuit diagram illustrating an example of the pixel included in the display device of FIG. 1. For convenience, FIG. 2 shows a pixel PX connected to an i-th first scan line S1i, an i-th second scan line S2i, a j-th data line Dj, and a j-th sensing line Sj. For convenience of description, hereinafter, the i-th first scan line S1i is referred to as a first scan line S1i, the i-th second scan line S2i is referred to as a second scan line S2i, and the j-th data line Dj is referred to as a data line Dj, and the j-th sensing line Sj is referred to as a sensing line Sj.

Referring to FIG. 2, the pixel PX may include an organic light emitting diode OLED and a pixel circuit PXC for controlling an amount of a current supplied to the organic light emitting diode OLED.

An anode electrode of the organic light emitting diode OLED is connected to the pixel circuit PXC, and a cathode electrode is connected to the second driving power ELVSS. The organic light emitting diode OLED generates light of a predetermined luminance in correspondence with a current supplied from the pixel circuit PXC.

The pixel circuit PXC supplies a predetermined current to the organic light emitting diode OLED in correspondence with the data signal supplied through the data line Dj. To this end, the pixel circuit PXC includes first to third transistors M1 to M3 and a storage capacitor Cst.

A first electrode of the first transistor M1 (driving transistor) is connected to the first driving power ELVDD, and a second electrode is connected to the anode electrode of the organic light emitting diode OLED. A gate electrode of the first transistor M1 is connected to a first node N1. The first transistor M1 controls the amount of the current supplied to the organic light emitting diode OLED in correspondence with a voltage applied to the gate electrode, that is, the first node N1.

A first electrode of the second transistor M2 (switching transistor) is connected to the data line Dj, and a second electrode is connected to the first node N1. A gate electrode of the second transistor M2 is connected to the first scan line S1i. When the scan signal is supplied to the first scan line S1i, the second transistor M2 is turned on to electrically connect the data line Dj and the first node N1 to each other.

A first electrode of the third transistor M3 (sensing transistor) is connected to the anode electrode of the organic light emitting diode OLED, and a second electrode is connected to the sensing line Sj. A gate electrode of the third transistor M3 is connected to the second scan line S2i. When the sensing signal is supplied to the second scan line S2i, the third transistor M3 is turned on to electrically connect the sensing line Sj and the organic light emitting diode OLED to each other.

The storage capacitor Cst is connected between the first node N1 and the anode electrode of the organic light emitting diode OLED. The storage capacitor Cst stores a voltage corresponding to the data signal supplied through the data line Dj.

In various embodiments of the inventive concepts, the pixel circuit PXC is not limited to the above. For example, in another embodiment, the organic light emitting diode OLED may be disposed between the first driving power ELVDD and the first transistor M1. In other various embodiments, the structure of the pixel circuit PXC may be variously changed to include the third transistor M3 for sensing a characteristic of the first transistor M1 and the organic light emitting diode OLED.

In addition, FIG. 2 shows an example in which the transistors M1 to M3 configuring the pixel circuit PXC are N-type transistors. Here, at least one of the first transistors M1 to M3 may be set to an oxide semiconductor thin film transistor including an active layer configured of an oxide semiconductor. In addition, at least one of the first to third transistors M1 to M3 may be set to an LTPS thin film transistor including an active layer configured of polysilicon. However, the inventive concepts are not limited thereto. That is, in other embodiments, at least some or all of the transistors configuring the pixel circuit PXC may be configured of P-type transistors.

Figure 3:
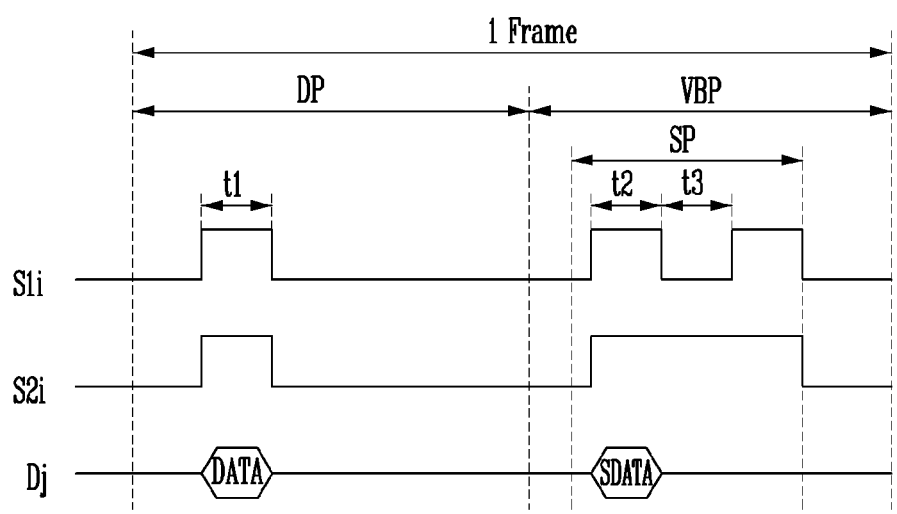
FIG. 3 is a timing diagram illustrating a method of driving the pixel shown in FIG. 2.

FIG. 3 is a timing diagram illustrating a method of driving the pixel shown in FIG. 2. FIG. 3 illustrates an embodiment of a driving waveform supplied to the pixel PX of FIG. 2 during one frame period 1 Frame. In the embodiment of FIG. 3, the pixel PX may be a pixel PX of a pixel column selected to receive the sensing signal during the sensing period SP among the pixels PX provided in the display device.

Referring to FIG. 3, one frame period 1 Frame may include a driving period DP and a vertical blank period VBP.

The scan signal is applied to the first scan line S1$i$ and the sensing signal is applied to the second scan line S2$i$ during a first period t1 of the driving period DP. Then, the second transistor M2 and the third transistor M3 are turned on.

In addition, a data signal DATA corresponding to the grayscale of the image data is applied to the data line Dj during the first period t1. The data signal DATA is supplied to the first node N1, that is, one electrode of the storage capacitor Cst through the second transistor M2. The storage capacitor Cst may store a voltage corresponding to the data signal DATA.

In an embodiment, a voltage of an initialization power may be provided to the sensing line Sj during the first period t1. The initialization power is supplied to the other electrode of the storage capacitor Cst through the third transistor M3. Then, the storage capacitor Cst may store a voltage corresponding to a difference between the data signal DATA and the initialization power.

In an embodiment, the initialization power may be set in correspondence with deterioration of the organic light emitting diode OLED. When the initialization power is supplied to the pixel PX during the first period, a voltage required for the storage capacitor Cst may be charged without being affected by the deterioration of the organic light emitting diode OLED.

Thereafter, the first transistor M1 supplies a current corresponding to the voltage stored in the storage capacitor Cst to the organic light emitting diode OLED, and the organic light emitting diode OLED may emit light at a predetermined luminance in correspondence with the supplied current.

The vertical blank period VBP may include the sensing period SP. The sensing period SP may be activated when operation power of the display device is turned off or turned on to be included in the vertical blank period VBP. That is, the sensing period SP may be activated during a standby time during which the operation power of the display device is turned on or turned off. However, the inventive concepts are not limited thereto, and the sensing period SP may be activated in any frame by a regular frame period or user setting.

The scan signal is applied to the first scan line S1$i$ during a second period t2 of the sensing period SP and thus the second transistor M2 is turned on. The sensing signal is applied to the second scan line S2$i$ and thus the third transistor M3 is turned on. In addition, a sensing voltage SDATA for pixel sensing may be applied to the data line Dj during the second period t2.

In an embodiment, a black grayscale voltage may be applied as the sensing voltage SDATA. When the first transistor M1 is turned off by the black grayscale voltage, a voltage is applied to the sensing line Sj in correspondence with mobility of the first transistor M1. Therefore, the mobility of the first transistor M1 may be measured by measuring a current and/or a voltage of the sensing line Sj.

In an embodiment, a reference voltage preset as the sensing voltage SDATA may be applied. The reference voltage may be set to a voltage at which the first transistor M1 may be turned on. When the first transistor M1 is turned on by the reference voltage, a current corresponding to the reference voltage is supplied from the first transistor M1 to the sensing line Sj through the third transistor M3. The voltage of the sensing line Sj may increase by the current supplied to the sensing line Sj. The voltage of the sensing line Sj may be a voltage obtained by subtracting the threshold voltage of the first transistor M1 from the reference voltage. That is, the voltage of the sensing line Sj may be determined according to the threshold voltage of the first transistor M1, and the threshold voltage of the first transistor M1 may be measured by measuring the current and/or the voltage of the sensing line Sj.

The scan signal is not applied to the first scan line S1$i$ during a third period t3 of the sensing period SP, and thus the second transistor M1 is turned off. During the third period t3, a predetermined current may be applied through the sensing line Sj. The current applied to the sensing line Sj is supplied to the organic light emitting diode OLED through the third transistor M3 of the turn-on state, and a voltage is applied to the anode electrode of the organic light emitting diode OLED. A resistance value of the OLED may change in correspondence with deterioration. Therefore, the voltage applied to the anode electrode of the organic light emitting diode OLED in correspondence with the sensing current may include deterioration information of the organic light emitting diode OLED. A voltage of the anode electrode of the organic light emitting diode OLED may act as a feedback to the current applied to the sensing line Sj, and a deterioration degree of the organic light emitting diode OLED may be measured by measuring the current and/or the voltage of the sensing line Sj.

In various embodiments, after the third period t3 of the sensing period SP, a period may be provided for initializing the voltage of the first node N1 and/or the voltage of the anode electrode of the organic light emitting diode OLED or for resetting the voltage of the first node N1 and/or the voltage of the anode electrode of the organic light emitting diode OLED to a voltage set before the sensing period SP.

The state information of the pixel PX measured as described above may be transferred to the timing controller 240 and/or the data driver 220 shown in FIG. 1, and may be used to correct the data signal DATA.

Hereinafter, a configuration of the scan driver 210 that supplies the scan signal through the first scan line S1$i$ and supplies the sensing signal through the second scan line S2$i$ in order to drive the pixel PX as described above will be specifically described.

Figure 4:
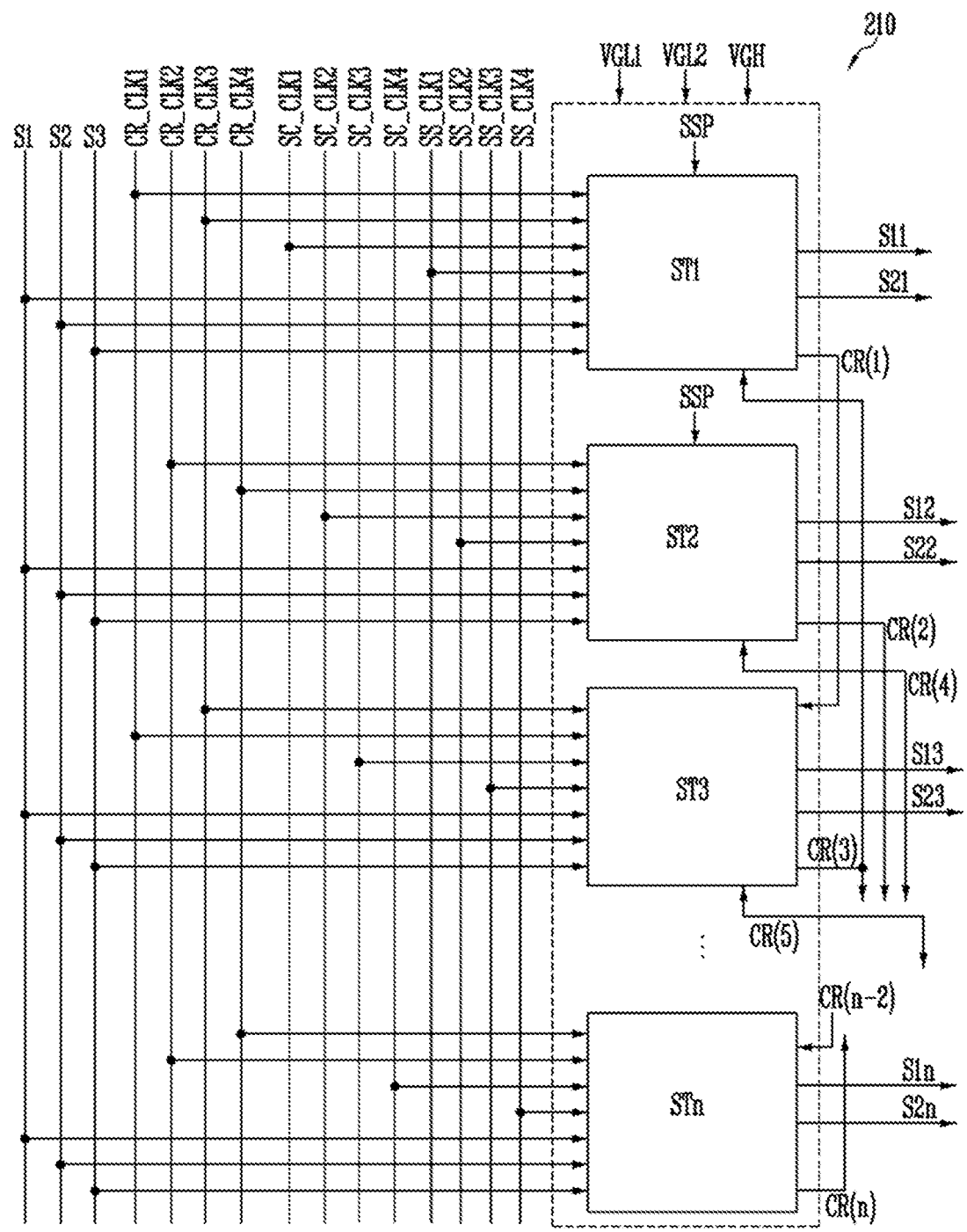
FIG. 4 is a diagram schematically illustrating a configuration of a scan driver shown in FIG. 1.

FIG. 4 is a diagram schematically illustrating a configuration of the scan driver shown in FIG. 1.

Referring to FIG. 4, the scan driver 210 according to an embodiment may include stages ST1 to STn connected to each of the first scan lines S11 to S1$n$ and the second scan lines S21 to S2$n$. The number of stages ST1 to STn provided in the scan driver 210 may be variously modified according to the number of pixel columns provided in the display unit 100.

Each of the stages ST1 to STn may receive the scan start signal SSP or a carry signal of a previous stage. For example, a first stage ST1 may receive the scan start signal SSP, and the remaining stages ST2 to STn may receive the carry signal supplied from the previous stage. Alternatively, for example, the first stage ST1 and the second stage ST2 may receive the scan start signal SSP, and the remaining stages ST3 to STn may receive carry signals CR(1) to CR(n−2) provided from the previous stage.

In FIG. 4, an embodiment in which the first stage ST1 and the second stage ST2 receive the scan start signal SSP is shown. In various embodiments, the scan start signal SSP applied to the first stage ST1 and the scan start signal SSP applied to the second stage ST2 are signals of the same waveform and may be set to have a difference of approximately half period. However, the inventive concepts are not limited thereto.

The stages ST1 to STn may further receive a carry signal output from a subsequent stage. For example, the first stage ST1 may receive a carry signal output from the third stage ST3 and the second stage ST2 may receive a carry signal output from a fourth stage that is not shown.

In such an embodiment, a separate control signal instead of the carry signal of the subsequent stage may be further supplied to at least one stage (for example, an (n−1)-th stage which is not shown, an n-th stage STn, or the like).

The stages ST1 to STn may receive at least two of the carry clock signals CR_CLK1 to CR_CLK4, any one of the scan clock signals SC_CLK1 to SC_CLK4, and any one of the sensing clock signals SS_CLK1 to SS_CLK4.

The clock signals CR_CLK1 to CR_CLK4, SC_CLK1 to SC_CLK4, and SS_CLK1 to SS_CLK4 may be square wave signals in which a gate on voltage (for example, a low level voltage for P-type transistors and a high level voltage for N-type transistors) for turning on transistors included in the stages ST1 to STn and a gate off voltage (for example, a high level voltage for the P-type transistors and a low level voltage for the N-type transistors) for turning off the transistors included in the stages ST1 to STn repeat. In an embodiment, a gate on voltage period may be set to be shorter than a gate off voltage period in one period of the clock signals CR_CLK1 to CR_CLK4, SC_CLK1 to SC_CLK4, and SS_CLK1 to SS_CLK4. For example, the clock signals CR_CLK1 to CR_CLK4, SC_CLK1 to SC_CLK4, and SS_CLK1 to SS_CLK4 may have four horizontal periods, and the gate on voltage period may be set to be shorter than the gate off voltage period. For example, the gate on voltage period may have a period between one horizontal period and two horizontal periods. However, the inventive concepts are not limited thereto.

The carry clock signals CR_CLK1 to CR_CLK4 may be signals having the same waveform and shifted in phase with each other. In an embodiment, the carry clock signals CR_CLK1 to CR_CLK4 may be signals of which phases are shifted by ¼ periods. For example, a second carry clock signal CR_CLK2 may be a signal having the same waveform as a first carry clock signal CR_CLK1 and shifted in phase by ¼ periods. Here, at least a portion of the gate on voltage period of the first carry clock signal CR_CLK1 and the gate on voltage period of the second carry clock signal CR_CLK2 may overlap each other. Here, the gate on voltage may be about 25 to 29 V, and the gate off voltage may be about −7 V, but the gate on voltage and the gate off voltage are not limited thereto.

The stages ST1 to STn may receive at least two carry clock signals CR_CLK1 to CR_CLK4. The stages ST1 to STn may receive two carry clock signals CR_CLK1 to CR_CLK4 having the same waveform and shifted in phase by ½ periods. For example, the first stage ST1 may receive the first carry clock signal CR_CLK1 and the third carry clock signal CR_CLK3, the second stage ST2 may receives the second carry clock signal CR_CLK2 and the fourth carry clock signal CR_CLK4, and the third stage ST3 may receive the third carry clock signal CR_CLK3 and the first carry clock signal CR_CLK1.

The scan clock signals SC_CLK1 to SC_CLK4 may be signals having the same waveform and shifted in phase with each other. In an embodiment, the scan clock signals SC_CLK1 to SC_CLK4 may be signals shifted in phase by ¼ periods. For example, the second scan clock signal SC_CLK2 may be a signal having the same waveform as the first scan clock signal SC_CLK1 and shifted in phase by ¼ periods. Here, at least a portion of the gate on voltage period of the first scan clock signal SC_CLK1 and the gate on voltage period of the second scan clock signal SC_CLK2 may overlap each other. Here, the gate on voltage may be about 25 to 29 V, and the gate off voltage may be about −5 V, but the gate on voltage and the gate off voltage are not limited thereto.

The stages ST1 to STn may receive a scan clock signal synchronized with any one of at least two carry clock signals CR_CLK1 to CR_CLK4 input to the stages ST1 to STn. For example, the first stage ST1 may receive the first scan clock signal SC_CLK1, the second stage ST2 may receive the second scan clock signal SC_CLK2, and the third stage ST3 may receive the third scan clock signal SC_CLK3.

The sensing clock signals SS_CLK1 to SS_CLK4 may be signals having the same waveform and shifted in phase with each other. In an embodiment, the sensing clock signals SS_CLK1 to SS_CLK4 may be signals shifted in phase by ¼ periods. For example, the second sensing clock signal SS_CLK2 may be a signal having the same waveform as the first sensing clock signal SS_CLK1 and shifted in phase by ¼ periods. Here, at least a portion of the gate on voltage period of the first sensing clock signal SS_CLK1 and the gate on voltage period of the second sensing clock signal SS_CLK2 may overlap each other. Here, the gate on voltage may be about 25 to 29 V, and the gate off voltage may be about −5 V, but the gate on voltage and the gate off voltage are not limited thereto.

The stages ST1 to STn may receive a sensing clock signal synchronized with any one of at least two carry clock signals CR_CLK1 to CR_CLK4 input to the stages ST1 to STn. For example, the first stage ST1 may receive the first sensing clock signal SS_CLK1, the second stage ST2 may receive the second sensing clock signal SS_CLK2, and the third stage ST3 may receive the third sensing clock signal SS_CLK3.

The stages ST1 to STn may receive a first control signal S1, a second control signal S2, and a third control signal S3. In addition, the stages ST1 to STn may receive first power VGL1, second power VGL2, and third power VGH. The first to third control signals S1 to S3 and the first to third power VGL1, VGL2, and VGH are global signals, and may be applied from the timing controller 240 shown in FIG. 1, a power supply that is not shown, and/or the like to the stages ST1 to STn.

The first control signal S1 may be selectively supplied to a stage connected to a pixel column to be sensed in a corresponding frame to charge a sensing node in the stages ST1 to STn.

Figure 6:
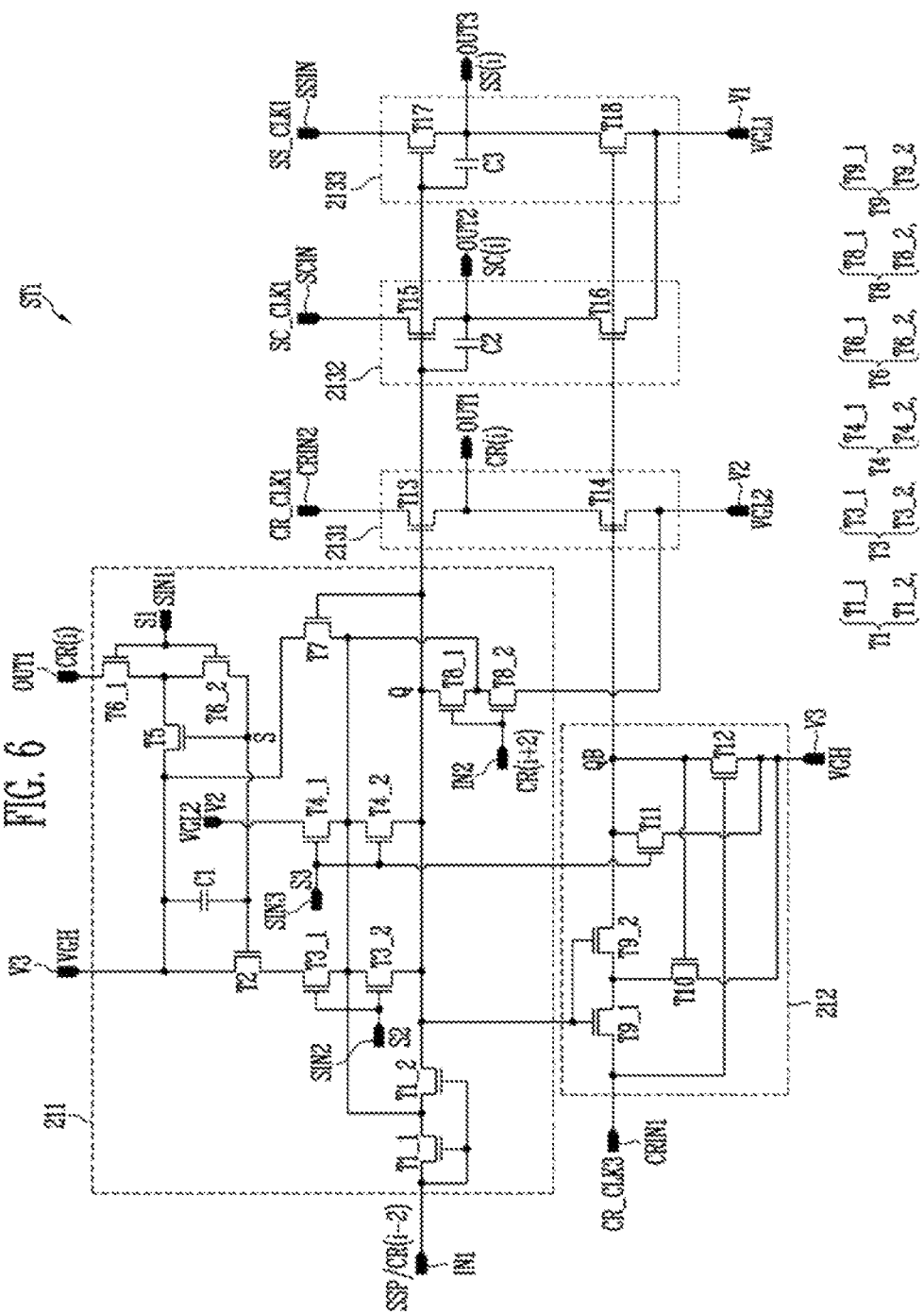
FIG. 6 is a circuit diagram according to an embodiment of the stage shown in FIG. 5.

The second control signal S2 may supply the voltage of the sensing node charged by the first control signal S1 to a driving node Q of FIG. 6 in the stages ST1 to STn.

The third control signal S3 may be supplied to initialize the voltage of the driving node (hereinafter, referred to as a Q node) in the stages ST1 to STn during a reset period provided after the sensing period SP shown in FIG. 3.

The first power VGL1 and the second power VGL2 may be set to a gate off voltage, and the third power VGH may be set to a gate on voltage. In an embodiment, the first power VGL1 may be set to about −5 V, and the second power VGL2 may be set to a voltage lower than the first power VGL1, for example, about −7 V. In addition, the third power VGH may be set to about 25 to 29 V.

The stages ST1 to STn may output scan signals to the first scan lines S11 to S1n and output sensing signals to the second scan lines S21 to S2n in correspondence with input signals.

Hereinafter, a configuration of the stages ST1 to STn will be described in detail by taking any one of the stages ST1 to STn as an example.

Figure 5:
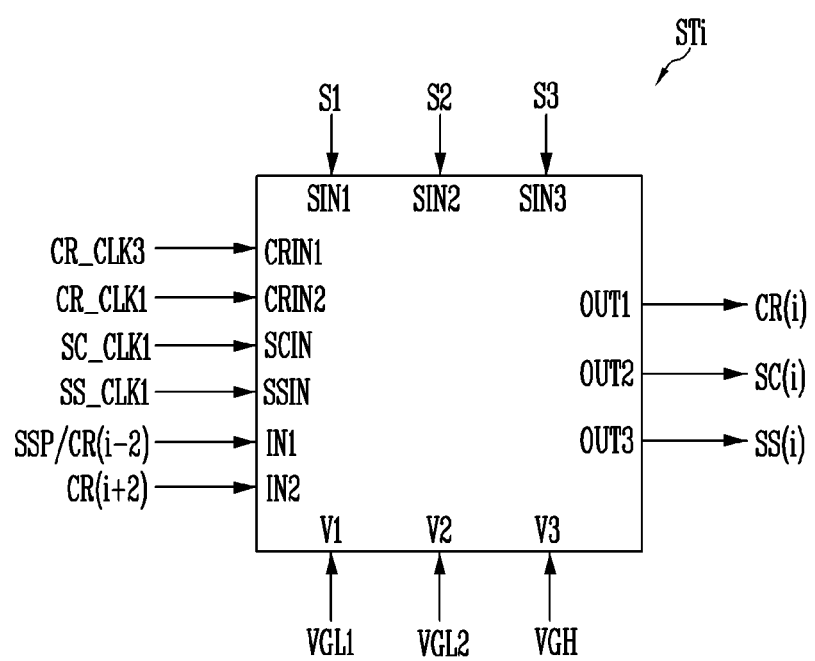
FIG. 5 is a diagram schematically illustrating a configuration of a stage shown in FIG. 4.

FIG. 5 is a diagram schematically illustrating a configuration of the stage shown in FIG. 4. In FIG. 5, an i-th stage STi that may be connected to the pixel PX shown in FIG. 2 through the i-th first scan line S1i and the i-th second scan line S2i is shown as an example. Hereinafter, for convenience of description, the i-th first scan line S1i is referred to as a first scan line S1i, the i-th second scan line S2i is referred to as a second scan line S2i, and the i-th stage STi is referred to as a stage STi.

Referring to FIG. 5, the stage STi may include first and second carry clock input terminals CRIN1 and CRIN2, a scan clock input terminal SCIN, a sensing clock input terminal SSIN, first to third input terminals V1 to V3, first to third control signal input terminals SIN1 to SIN3, and first and second input terminals IN1 and IN2.

The first and second carry clock input terminals CRIN1 and CRIN2 may receive carry clock signals of a half period difference among the first to fourth carry clock signals CR_CLK1 to CR_CLK4. For example, the first carry clock input terminal CRIN1 may receive the first carry clock signal CR_CLK1, and the second carry clock input terminal CRIN2 may receive the third carry clock signal CR_CLK3. The reverse is also possible. Alternatively, the first carry clock input terminal CRIN1 may receive the second carry clock signal CR_CLK2, and the second carry clock input terminal CRIN2 may receive the fourth carry clock signal CR_CLK4. The reverse is also possible.

In the stage STi according to an embodiment shown in FIG. 5, the third carry clock signal CR_CLK3 is input to the first carry clock input terminal CRIN1 and the first carry clock signal CR_CLK1 is input to the second carry clock input terminal CRIN2.

The scan clock input terminal SCIN may receive any one of the first to fourth scan clock signals SC_CLK1 to SC_CLK4. The scan clock signal input to the scan clock input terminal SCIN may be a signal synchronized with the carry clock signal input to the second carry clock input terminal CRIN2 during at least the driving period DP in one frame.

In the stage STi according to the embodiment shown in FIG. 5, the first scan clock signal SC_CLK1 synchronized with the first carry clock signal CR_CLK1 is input to the scan clock input terminal SCIN.

The sensing clock input terminal SSIN may receive any one of the first to fourth sensing clock signals SS_CLK1 to SS_CLK4. The sensing clock signal input to the sensing clock input terminal SSIN may be a signal synchronized with the carry clock signal input to the second carry clock input terminal CRIN2 during at least the driving period DP in one frame.

In the stage STi according to the embodiment shown in FIG. 5, the first sensing clock signal SS_CLK1 synchronized with the first carry clock signal CR_CLK1 is input to the sensing clock input terminal SSIN.

The first power input terminal V1 receives the first power VGL1, the second power input terminal V2 receives the second power VGL2, and the third power input terminal V3 receives the third power VGH.

The first control signal input terminal SIN1 receives the first control signal S1, the second control signal input terminal SIN2 receives the second control signal S2, and the third control signal input terminal SIN3 receives the third control signal S3.

The first input terminal IN1 may receive the scan start signal SSP or the carry signal of the previous stage. In an embodiment, the carry signal of the previous stage input to the first input terminal IN1 may be an (i−2)-th carry signal CR(i−2) output from an (i−2)-th stage, but is not limited thereto.

The second input terminal IN2 may receive the carry signal of the subsequent stage. In an embodiment, the carry signal of the subsequent stage input to the second input terminal IN2 may be an (i+2)-th carry signal CR(i+2) output from an (i+2)-th stage, but is not limited thereto.

In addition, the stage STi may include first to third output terminals OUT1, OUT2, and OUT3. The first output terminal OUT1 outputs a carry signal CR(i). The carry signal CR(i) output from the first output terminal OUT1 may be input to at least one of the previous stages and/or at least one of the next stages.

The second output terminal OUT2 is connected to the first scan line S1i and outputs a scan signal SC(i). The third output terminal OUT3 is connected to the second scan line S2i and outputs a sensing signal SS(i).

Hereinafter, a more specific circuit diagram of the stage STi described above will be described.

Figure 7:
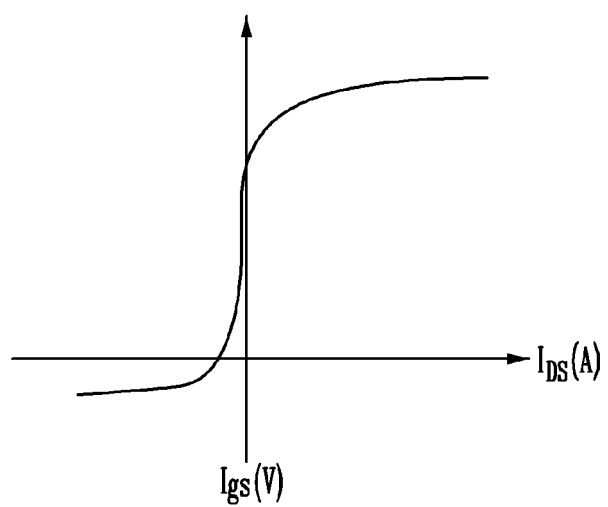
FIG. 7 is a graph illustrating a Vgs-Ids curve.

FIG. 6 is a circuit diagram according to an embodiment of the stage shown in FIG. 5, and FIG. 7 is a graph illustrating a Vgs-Ids curve.

Specifically, FIG. 6 shows a circuit diagram of the i-th stage STi shown in FIG. 5 as an example. In particular, FIG. 6 shows the stage STi in which the third carry clock signal CR_CLK3 is input to the first carry clock input terminal CRIN1 and the first carry clock signal CR_CLK1 is input to the second carry clock input terminal CRIN2. Therefore, FIG. 6 shows the stage STi in which the first scan clock signal SC_CLK1 synchronized with the first carry clock signal CR_CLK1 is input to the scan clock input terminal SCIN and the first sensing clock signal SS_CLK1 synchronized with the first carry clock signal CR_CLK1 is input to the sensing clock input terminal SSIN.

The embodiment shown in FIG. 6 may be equally or similarly applied to at least some or all of the stages ST1 to STn shown in FIG. 4.

Referring to FIGS. 6 and 7, the stage STi according to an embodiment may include a first controller 211, a second controller 212, and first to third output buffers 2131, 2132, and 2133.

The first controller 211 controls a voltage of the driving node Q based on input signals. The first controller 211 includes first to eighth transistors T1 to T8 and a first capacitor C1.

The first transistor T1 may be configured of a (1_1)-th transistor T1_1 and a (1_2)-th transistor T1_2. The (1_1)-th transistor T1_1 and the (1_2)-th transistor T1_2 may be connected in series between a first input terminal IN1 and the driving node Q. Gate electrodes of the (1_1)-th transistor T1_1 and the (1_2)-th transistor T1_2 are connected to the first input terminal IN1. When the scan start signal SSP or the carry signal CR(i−2) of the previous stage is input to the first input terminal IN1, the (1_1)-th transistor T1_1 and the (1_2)-th transistor T1_2 may be turned on to transfer the scan start signal SSP or the carry signal CR(i−2) of the previous stage to the driving node Q. That is, the first transistor T1 may charge the voltage of the driving node Q to the gate on voltage in response to the scan start signal SSP or the carry signal CR(i−2) of the previous stage.

The second transistor T2 is connected between the third power input terminal V3 and the third transistor T3. A gate electrode of the second transistor T2 is connected to a sensing node S. The second transistor T2 may be turned on when the sensing node S is charged to the gate on voltage.

The third transistor T3 may be configured of a (3_1)-th transistor T3_1 and a (3_2)-th transistor T3_2. The (3_1)-th transistor T3_1 and the (3_2)-th transistor T3_2 may be connected in series between the second transistor T2 and the driving node Q. Gate electrodes of the (3_1)-th transistor T3_1 and the (3_2)-th transistor T3_2 are connected to a second control signal input terminal SIN2. When a second control signal S2 is input to the second control signal input terminal SIN2, the third transistor T3 may be turned on to connect the second transistor T2 and the driving node Q to each other.

When the sensing node S is charged to the gate on voltage during the driving period DP, the second transistor T2 and the third transistor T3 as described above may be turned on by the second control signal S2 supplied at least once during the sensing period SP, to transfer the third power VGH to the driving node Q. Therefore, the driving node Q may be charged to the gate on voltage during the sensing period SP.

The fourth transistor T4 may be configured of a (4_1)-th transistor T4_1 and a (4_2)-th transistor T4_2. The (4_1)-th transistor T4_1 and the (4_2)-th transistor T4_2 may be connected in series between the second power input terminal V2 and the driving node Q. Gate electrodes of the (4_1)-th transistor T4_1 and the (4_2)-th transistor T4_2 are connected to the third control signal input terminal SIN3. When the third control signal S3 is input to the third control signal input terminal SIN3, the (4_1)-th transistor T4_1 and the (4_2)-th transistor T4_2 may be turned on to transfer the second power VGL2 to the driving node Q. That is, the fourth transistor T4 may be turned on by the third control signal S3 supplied at least once in one frame to set (reset) the voltage of the driving node Q to the gate off voltage.

The fifth transistor T5 may be connected between the third power input terminal V3 and a common node of sixth transistors T6_1 and T6_2. A gate electrode of the fifth transistor T5 may be connected to the sensing node S. When the sensing node S is set to the gate on voltage, the fifth transistor T5 may be turned on to apply the high voltage of the third power VGH input to the third power input terminal V3, to the common node of the sixth transistors T6_1 and T6_2.

When the sensing node S is charged to the gate on voltage (that is, a drain voltage of the (6_2)-th transistor T6_2 has the gate on voltage), and the carry signal CR(i) and the first control signal S1 are input as the gate off voltages (that is, source and gate voltages of the (6_2)-th transistor T6_2 have the gate off voltage, that is, Vgs=0), source-drain current Ids may occur in the sixth transistor T6 according to the Vgs characteristic curve shown in FIG. 7. Such a leakage current may transfer the carry signal CR(i) of the gate off voltage to the sensing node S and cause a voltage drop of the sensing node S. In the case described above, the fifth transistor T5 is turned on by the gate on voltage of the sensing node S to transfer the gate on voltage of the third power VGH to a source node of the (6_2)-th transistor T6_2. Therefore, a turn-off characteristic of the (6_2)-th transistor T6_2 may be improved, and a leakage current from the first output terminal OUT1 to the sensing node S may be blocked.

The sixth transistor T6 may be configured of a (6_1)-th transistor T6_1 and a (6_2)-th transistor T6_2. The (6_1)-th transistor T6_1 and the (6_2)-th transistor T6_2 may be connected in series between the first output terminal OUT1 and the sensing node S. Gate electrodes of the (6_1)-th transistor T6_1 and the (6_2)-th transistor T6_2 are connected to the first control signal input terminal SIN1. When the first control signal S1 is input to the first control signal input terminal SIN1, the (6_1)-th transistor T6_1 and the (6_2)-th transistor T6_2 may be turned on to supply the carry signal CR(i) output from a corresponding stage STi to the sensing node S. That is, when the first control signal S1 is selectively applied to the stage STi in synchronization with the output of the carry signal CR(i) during the driving period DP, the sixth transistor T6 may be turned on to charge the voltage of the sensing node S to the gate on voltage of the carry signal CR(i).

The seventh transistor T7 is connected between the third power input terminal V3 and a common node of eighth transistors T8_1 and T8_2. A gate electrode of the seventh transistor T7 is connected to the driving node Q. When the driving node Q is set to the gate on voltage, the seventh transistor T7 may be turned on to apply the third power VGH input to the third power input terminal V3, to the common node of the first transistors T1_1 and T1_2, the common node of the third transistors T3_1 and T3_2, the common node of the fourth transistors T4_1 and T4_2, and the common node of the eighth transistors T8_1 and T8_2.

In an embodiment of the inventive concepts, when the scan signal SC(i) and the sensing signal SS(i) are output, the voltage of the driving node Q may increase to about twice the gate on voltage (hereinafter, referred to as 2 high voltage) by coupling of a second capacitor C2 and a third capacitor C3. At this time, when the gate off voltage is applied to the first transistors T1_1 and T1_2, the third transistors T3_1 and T3_2, the fourth transistors T4_1 and T4_2, and the eighth transistors T8_1 and T8_2 of which one end is connected to the driving node Q, high stress may be applied to a transistor due to a large potential difference between both ends of the transistor. When the seventh transistor T7 is turned on by the voltage of the driving node Q, the high voltage of the third power VGH may be applied to the common nodes of the first transistors T1_1 and T1_2, the third transistors T3_1 and T3_2, the fourth transistors T4_1 and T4_2, and the eighth transistors T8_1 and T8_2. Therefore, the potential difference between the both ends of the transistors may be reduced. As a result, the stress applied to the transistors may be reduced.

In addition, as described with reference to the fifth transistor T5, when the driving node Q is set to the gate on voltage, the seventh transistor T7 may block a leakage current that may be transferred to the driving node Q through the (1_2)-th transistor T1_2, the (3_2)-th transistor T3_2, the (4_2)-th transistor T4_2, and the (8_1)-th transistor T8_1.

The eighth transistor T8 may be configured of the (8_1)-th transistor T8_1 and the (8_2)-th transistor T8_2. The (8_1)-th transistor T8_1 and the (8_2)-th transistor T8_2 are connected in series between the driving When the carry signal CR(i+2) of the subsequent stage is input to the second input terminal IN2, the (8_1)-th transistor T8_1 and the (8_2)-th transistor T8_2 may be turned on to apply the second power VGL2 input to the second power input terminal V2, to the driving node Q. That is, when node Q and the second power input terminal V2. Gate electrodes of the (8_1)-th transistor T8_1 and the (8_2)-th transistor T8_2 are connected to the second input terminal IN2. the carry signal CR(i+2) of the subsequently stage is applied to the second input terminal IN2, the eighth transistor T8 may be turned on to discharge the voltage of the driving node Q to a voltage of the second power VGL2, that is, the gate off voltage.

The first capacitor C1 is connected between the third power input terminal V3 and the sensing node S. The first capacitor C1 may charge a voltage corresponding to the voltage of the sensing node S when the sensing node S is set to the gate on voltage.

The second controller 212 controls a voltage of an inversion driving node QB based on input signals. The second controller 212 includes ninth to twelfth transistors T9 to T12.

The ninth transistor T9 may be configured of a (9_1)-th transistor T9_1 and a (9_2)-th transistor T9_2. The (9_1)-th transistor T9_1 and the (9_2)-th transistor T9_2 are connected in series between the first carry clock input terminal CRIN1 and the inversion driving node QB. Gate electrodes of the (9_1)-th transistor T9_1 and the (9_2)-th transistor T9_2 are connected to the driving node Q. When the driving node Q is set to the gate on voltage, the (9_1)-th transistor T9_1 and the (9_2)-th transistor T9_2 may be turned on to apply the third carry clock signal CR_CLK3 input to the first carry clock input terminal CRIN1, to the inversion driving node QB. That is, while the ninth transistor T9 is turned on, the ninth transistor T9 may trigger the voltage of the inversion driving node QB between the gate on voltage and the gate off voltage in correspondence with the third carry clock signal CR_CLK3 input to the first carry clock input terminal CRIN1.

The tenth transistor T10 is connected between a common node of the ninth transistors T9_1 and T9_2 and the third power input terminal V3. A gate electrode of the tenth transistor T10 is connected to the inversion driving node QB. When the inversion driving node QB is set to the gate on voltage, the tenth transistor T10 may be turned on to apply the high voltage of the third power VGH input to the third power input terminal V3, to the common node of the ninth transistors T9_1 and T9_2.

When the inversion driving node QB is set to the gate on voltage (that is, a drain voltage of the (9_2)-th transistor T9_2 has the gate on voltage), and the driving node Q and the third carry clock signal CR_CLK3 are set to the gate off voltage (that is, a source and gate voltage of the (9_2)-th transistor T9_2 has the gate off voltage, Vgs=0), a source-drain current Ids may occur in the ninth transistor T9 according to the Vgs characteristic curve shown in FIG. 7. Such a leakage current may transfer the third carry clock signal CR_CLK3 of the gate off voltage to the inversion driving node QB and cause a voltage drop of the inversion driving node QB. In the case described above, the tenth transistor T10 is turned on by the gate on voltage of the inversion driving node QB to transfer the gate on voltage of the third power VGH to a source node of the (9_2)th transistor T9_2. Therefore, a turn-off characteristic of the (9_2)-th transistor T9_2 may be improved, and a leakage current from the first carry input terminal CRIN1 to the inversion driving node QB may be blocked.

The eleventh transistor T11 is connected between the inversion driving node QB and the third power input terminal V3. A gate electrode of the eleventh transistor T11 is connected to the third control signal input terminal SIN3. When the third control signal S3 is input to the third control signal input terminal SIN3, the eleventh transistor T11 may be turned on to apply the third power VGH input to the third power input terminal V3, to the inversion driving node QB. That is, the eleventh transistor T11 may be turned on by the third control signal S3 supplied at least once in one frame to set (for example, reset) the voltage of the inversion driving node QB to the voltage of the third power VGH, that is, the gate on voltage.

The twelfth transistor T12 is connected between the inversion driving node QB and the third power input terminal V3. A gate electrode of the twelfth transistor T12 is connected to the first carry clock input terminal CRIN1. When the third carry clock signal CR_CLK3 of the gate on voltage is input to the first carry clock input terminal CRIN1, the twelfth transistor T12 may be turned on to apply the third power VGH input to the third power input terminal V3, to the inversion driving node QB. That is, when the third carry clock signal CR_CLK3 is input to the first carry clock input terminal CRIN1, the twelfth transistor T12 may be turned on to charge the voltage of the inversion driving node QB to the voltage of the third power VGH, that is, the gate on voltage.

The first output buffer 2131 may control an output of the carry signal CR(i) in correspondence with the voltage of the driving node Q and the voltage of the inversion driving node QB. The first output buffer 2131 may include a thirteenth transistor T13 and a fourteenth transistor T14.

The thirteenth transistor T13 is connected between the second carry clock input terminal CRIN2 and the first output terminal OUT1. A gate electrode of the thirteenth transistor T13 is connected to the driving node Q. When the driving node Q is set to the gate on voltage, the thirteenth transistor T13 may be turned on to output the first carry clock signal CR_CLK1 input to the second carry clock input terminal CRIN2 to the first output terminal OUT1.

The fourteenth transistor T14 is connected between the first output terminal OUT1 and the second power input terminal V2. A gate electrode of the fourteenth transistor T14 is connected to the inversion driving node QB. When the inversion driving node QB is set to the gate on voltage, the fourteenth transistor T14 may be turned on to output the second power VGL2 input to the second power input terminal V2 to the first output terminal OUT1.

The first carry clock signal CR_CLK1 or the second power VGL2 output to the first output terminal OUT1 through the thirteenth transistor T13 or the fourteenth transistor T14 may be used as the carry signal CR(i).

Meanwhile, in various embodiments, the fourteenth transistor T14 may be connected to the first power input terminal V1 instead of the second power input terminal V2. In such an embodiment, the first power VGL1 input to the first power input terminal V1 may be output as the carry signal CR(i).

The second output buffer 2132 may control an output of the scan signal SC(i) in correspondence with the voltage of the driving node Q and the voltage of the inversion driving node QB. The second output buffer 2132 may include a fifteenth transistor T15, a sixteenth transistor T16, and a second capacitor C2.

The fifteenth transistor T15 is connected between the scan clock input terminal SCIN and the second output terminal OUT2. A gate electrode of the fifteenth transistor T15 is connected to the driving node Q. When the driving node Q is set to the gate on voltage, the fifteenth transistor T15 may be turned on to output the first scan clock signal SC_CLK1 input to the scan clock input terminal SCIN to the second output terminal OUT2.

The sixteenth transistor T16 is connected between the second output terminal OUT2 and the first power input terminal V1. A gate electrode of the sixteenth transistor T16 is connected to the inversion driving node QB. When the inversion driving node QB is set to the gate on voltage, the sixteenth transistor T16 may be turned on to output the first power VGL1 input to the first power input terminal V1 to the second output terminal OUT2.

The first scan clock signal SC_CLK1 or the first power VGL1 output to the second output terminal OUT2 through the fifteenth transistor T15 or the sixteenth transistor T16 may be used as the scan signal SC(i).

The second capacitor C2 is connected between the driving node Q and the second output terminal OUT2. The second capacitor C2 may enable the fifteenth transistor T15 to be more robust to a threshold voltage negative condition by coupling between the gate electrode and one electrode (for example, a drain electrode) of the fifteenth transistor T15.

Meanwhile, in various embodiments, the sixteenth transistor T16 may be connected to the second power input terminal V2 instead of the first power input terminal V1. In such an embodiment, the second power VGL2 input to the second power input terminal V2 may be output as the scan signal SC(i).

In addition, in various embodiments, the second capacitor C2 may be omitted.

The third output buffer 2133 may control an output of the sensing signal SS(i) in correspondence with the voltage of the driving node Q and the voltage of the inversion driving node QB. The third output buffer 2133 may include a seventeenth transistor T17, an eighteenth transistor T18, and a third capacitor C3.

The seventeenth transistor T17 is connected between the sensing clock input terminal SSIN and the third output terminal OUT3. A gate electrode of the seventeenth transistor T17 is connected to the driving node Q. When the driving node Q is set to the gate on voltage, the seventeenth transistor T17 may be turned on to output the first sensing clock signal SS_CLK1 input to the sensing clock input terminal SSIN, to the third output terminal OUT3.

The eighteenth transistor T18 is connected between the third output terminal OUT3 and the first power input terminal V1. A gate electrode of the eighteenth transistor T18 is connected to the inversion driving node QB. When the inversion driving node QB is set to the gate on voltage, the eighteenth transistor T18 may be turned on to output the first power VGL1 input to the first power input terminal V1, to the third output terminal OUT3.

The first sensing clock signal SS_CLK1 or the first power VGL1 output to the third output terminal OUT3 through the seventeenth transistor T17 or the eighteenth transistor T18 may be used as the sensing signal SS(i).

The third capacitor C3 is connected between the driving node Q and the third output terminal OUT3. The third capacitor C3 may enable the seventeenth transistor T17 to be more robust to a threshold voltage negative condition by coupling between the gate electrode and one electrode (for example, a drain electrode) of the seventeenth transistor T17.

Meanwhile, in various embodiments, the eighteenth transistor T18 may be connected to the second power input terminal V2 instead of the first power input terminal V1. In such an embodiment, the second power VGL2 input to the second power input terminal V2 may be output as the sensing signal SS(i).

In addition, in various embodiments, the third capacitor C3 may be omitted.

Hereinafter, a driving method of the stage STi described above will be described in more detail.

Figure 8:
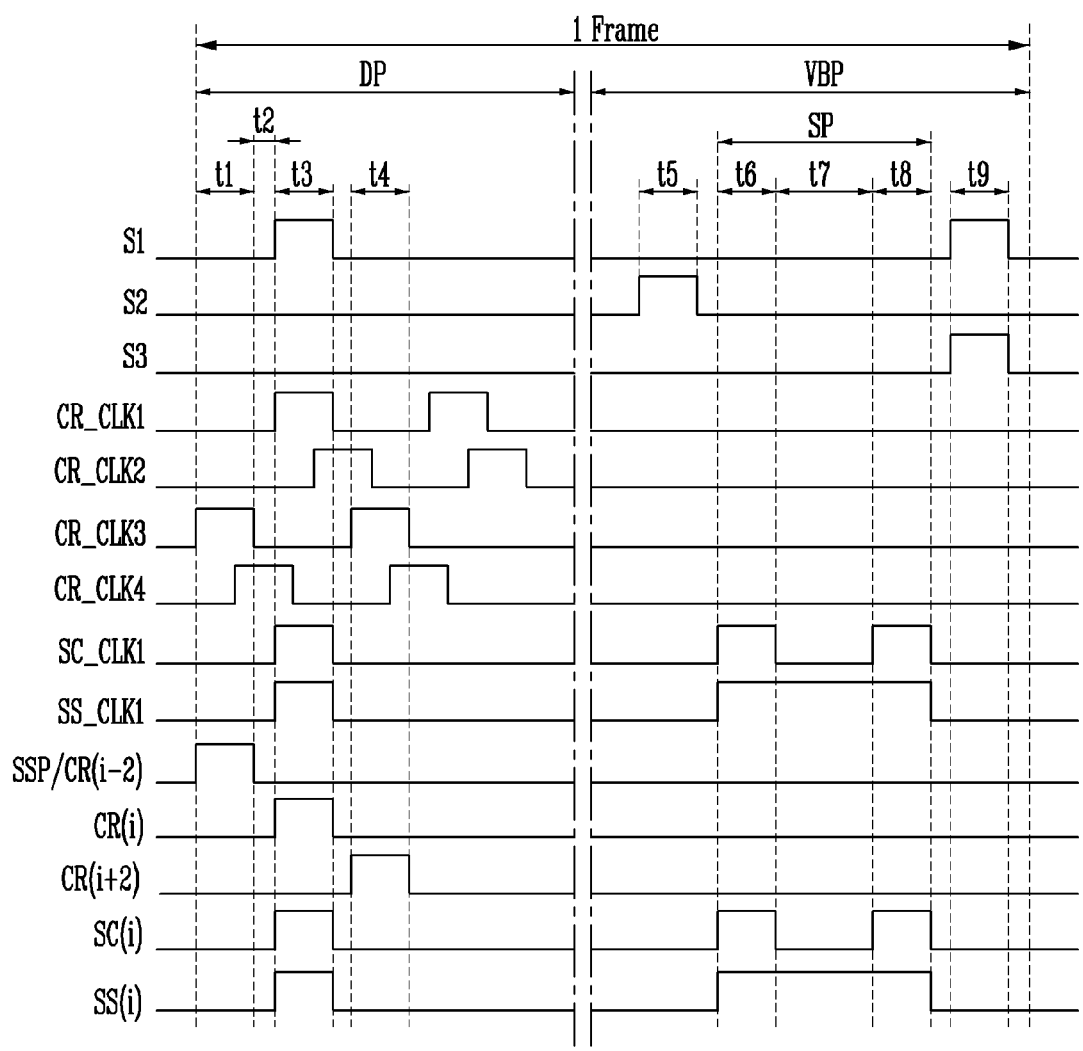
FIG. 8 is a timing diagram illustrating a method of driving the stage shown in FIG. 6.

FIG. 8 is a timing diagram illustrating a method of driving the stage shown in FIG. 6. FIG. 8 illustrates waveforms of the signals applied to the stage STi and the signals output from the stage STi during one frame period 1 Frame shown in FIG. 6. The one frame period 1 Frame shown in FIG. 8 may be synchronized with the driving waveform of the pixel PX shown in FIG. 3.

Referring to FIG. 8, one frame period 1 Frame may include a driving period DP and a vertical blank period VBP.

Referring to FIGS. 2, 3, 7, and 8, the scan start signal SSP or the carry signal CR(i−2) of the previous stage is applied to the first input terminal IN1 in synchronization with the third carry clock signal CR_CLK3 applied to the first carry clock input terminal CRIN1 during the first period t1 of the driving period DP. Therefore, the first transistor T1 and the twelfth transistor T12 are turned on.

When the first transistor T1 is turned on, the gate on voltage of the scan start signal SSP or the carry signal CR(i−2) of the previous stage is applied to the driving node Q. That is, the voltage of the driving node Q may be charged to a high voltage that is the gate on voltage.

When the driving node Q is set to the gate on voltage, the thirteenth transistor T13, the fifteenth transistor T15, and the seventeenth transistor T17 are turned on. However, during the first period t1, the first carry clock signal CR_CLK1, the first scan clock signal, and the first sensing clock signal SS_CLK1 are not applied to the second carry clock input terminal CRIN2, the scan clock input terminal SCIN, and the sensing clock input terminal SSIN, the carry signal CR(i), the scan signal SC(i), and the sensing signal SS(i) are not output to the first to third output terminals OUT1 to OUT3.

In addition, when the driving node Q is set to the gate on voltage, the seventh transistor T7 and the ninth transistor T9 are further turned on.

The supply of the third carry clock signal CR_CLK3 is stopped during the second period t2. Then, the gate off voltage of the third carry clock signal CR_CLK3 is applied to the inversion driving node QB through the ninth transistor T9 of the turn-on state. That is, the voltage of the inversion driving node QB may be set to a low voltage that is the gate off voltage.

As the inversion driving node QB is set to the gate off voltage, the fourteenth transistor T14, the sixteenth transistor T16, and the eighteenth transistor T18 are turned off.

The first carry clock signal CR_CLK1, the first scan clock signal SC_CLK1, and the first sensing clock signal SS_CLK1 are applied to the second carry clock input terminal CRIN2, the scan clock input terminal SCIN, and the sensing clock input terminal SSIN during the third period t3. Then, the carry signal CR(i), the scan signal SC(i), and the sensing signal SS(i) are output to the first to third output terminals OUT1 to OUT3 through the thirteenth transistor T13, the fifteenth transistor T15, and the seventeenth transistor T17 of the turn-on state.

During the third period t3, the voltage of the driving node Q may increase further than the gate on voltage set in the first period t1 by coupling of the second capacitor C2 and the third capacitor C3 (2 high voltage). At this time, the high voltage of the third power VGH may be applied to the common nodes of the first transistors T1_1 and T1_2, the third transistors T3_1 and T3_2, the fourth transistors T4_1 and T4_2, and the eighth transistors T8_1 and T8_2 connected to the driving node Q by the seventh transistor T7 of the turn-on state. Therefore, the potential difference between the both ends of the transistors may be reduced. As a result, the stress applied to the transistors may be reduced.

In addition, the first control signal S1 is applied to the first control signal input terminal SIN1 during the third period t3. Therefore, the sixth transistor T6 is turned on.

When the sixth transistor T6 is turned on, the carry signal CR(i) output to the first output terminal OUT1 is applied to the sensing node S. That is, the voltage of the sensing node S may be set to the high voltage that is the gate on voltage. At this time, the first capacitor C1 may charge the high voltage of the sensing node S. Only a stage in which the sensing node S is charged to the gate on voltage may output the scan signal SC(i) and the sensing signal SS(i) during the sensing period SP that will be described later by receiving the first control signal S1 in synchronization with the carry signal CR(i) during the third period t3.

When the sensing node S is set to the gate on voltage, the fifth transistor T5 may be turned on.

The supply of the first carry clock signal CR_CLK1, the first scan clock signal SC_CLK1, and the first sensing clock signal SS_CLK1 to the second carry clock input terminal CRIN2, the scan clock input terminal SCIN, and the sensing clock input terminal SSIN is stopped during the fourth period t4. Then, the carry signal CR(i), the scan signal SC(i), and the sensing signal SS(i) are not output to the first to third output terminals OUT1 to OUT3.

At this time, the high voltage of the third power VGH may be applied to the common node of the sixth transistors T6_1 and T6_2 by the fifth transistor T5 of the turn-on state, and thus the leakage current from the first output terminal OUT1 to the sensing node S may be blocked. Therefore, a charge voltage of the sensing node S may be stably maintained.

In addition, during the fourth period t4, the carry signal CR(i+2) of the subsequent stage is input to the second input terminal IN2 and the third carry clock signal CR_CLK3 is input to the first carry clock input terminal CRIN1. Therefore, the eighth transistor T8 and the twelfth transistor T12 are turned on.

When the eighth transistor T8 is turned on, the second power VGL2 input to the second power input terminal V2 is applied to the driving node Q. That is, the driving node Q may be set to the low voltage that is the gate off voltage.

When the driving node Q is set to the gate off voltage, the thirteenth transistor T13, the fifteenth transistor T15, and the seventeenth transistor T17 are turned off. In addition, the seventh transistor T7 and the ninth transistor T9 are turned off.

When the twelfth transistor T12 is turned on, the third power VGH input to the third power input terminal V3 is applied to the inversion driving node QB. That is, the voltage of the inversion driving node QB may be set to the high voltage that is the gate on voltage.

When the inversion driving node QB is set to the gate on voltage, the fourteenth transistor T14, the sixteenth transistor T16, and the eighteenth transistor T18 are turned on. Then, the first power VGL1 and the second power VGL2, which are input to the first power input terminal V1 and the second power input terminal V2, are output as the carry signal CR(i), the scan signal SC(i), and the sensing signal SS(i). In other words, the carry signal CR(i), the scan signal SC(i), and the sensing signal SS(i) of the gate off voltage are output (the supply of the carry signal CR(i), the scan signal SC(i), and the sensing signal SS(i) to the pixel PX is stopped).

When the inversion driving node QB is set to the gate on voltage, the tenth transistor T10 is further turned on. The high voltage of the third power VGH may be applied to the common node of the ninth transistors T9_1 and T9_2 by the tenth transistor T10 of the turn-on state, and thus the leakage current from the first carry clock input terminal CRIN1 to the inversion driving node QB may be blocked. Therefore, the gate on voltage of the inversion driving node QB may be stably maintained.

In various embodiments, the second control signal S2 is applied to the second control signal input terminal SIN2 during the fifth period t5 of the vertical blank period VBP. Therefore, the third transistor T3 is turned on.

When the third transistor T3 is turned on, the third power VGH may be applied to the driving node Q through the second transistor T2 that is maintained as the turn-on state by the gate on voltage of the sensing node S, which is charged during the third period t3. That is, the driving node Q may be set to the high voltage that is the gate on voltage.

When the driving node Q is set to the gate on voltage, the thirteenth transistor T13, the fifteenth transistor T15, and the seventeenth transistor T17 are turned on. In addition, the seventh transistor T7 and the ninth transistor T9 are turned on.

When the ninth transistor T9 is turned on, the voltage of the inversion driving node QB is triggered in synchronization with the third carry clock signal CR_CLK3 input to the first carry clock input terminal CRIN1. Since the third carry clock signal CR_CLK3 is not applied during the sensing period SP, the voltage of the inversion driving node QB is set to the gate off voltage. Therefore, the fourteenth transistor T14, the sixteenth transistor T16, and the eighteenth transistor T18 are turned off.

Thereafter, during the sixth period t6 of the sensing period SP included in the vertical blank period VBP, the first scan clock signal SC_CLK1 and the first sensing clock signal SS_CLK1 are applied to the scan clock input terminal SCIN and the sensing clock input terminal SSIN. Then, the scan signal SC(i) and the sensing signal SS(i) are output to the second and third output terminals OUT2 and OUT3 through the fifteenth transistor T15 and the seventeenth transistor T17 of the turn-on state. The threshold voltage, the mobility, and the like of the driving transistor M1 in the pixel PX may be measured using the scan signal SC(i) and the sensing signal SS(i).

The supply of the first scan clock signal SC_CLK1 is stopped during the seventh period t7. Then, the output of the scan signal SC(i) is stopped and the degradation degree of the organic light emitting diode OLED in the pixel PX may be measured.

When the first scan clock signal SC_CLK1 is supplied again during the eighth period t8, the scan signal SC(i) may be output. During this period, the voltage of the first node N1 of the pixel PX and/or the voltage of the anode electrode of the organic light emitting diode OLED may be initialized or reset to a voltage set before the sensing period SP.

During the ninth period t9 of the vertical blank period VBP, the first control signal S1 is input to the first control signal input terminal SIN1, and the third control signal S3 is input to the third control signal input terminal SIN3.

When the first control signal S1 is input, the sixth transistor T6 is turned on. Since the carry signal CR(i) is not output from the stage STi during the ninth period t9, the gate off voltage of the carry signal CR(i) is applied to the sensing node S through the sixth transistor T6. That is, the sensing node S is reset to the gate off voltage.

When the third control signal S3 is input, the fourth transistor T4 is turned on. Therefore, the voltage of the second power VGL2 may be applied to the driving node Q, and thus the driving node Q may be reset to the gate off voltage.

Figure 9:
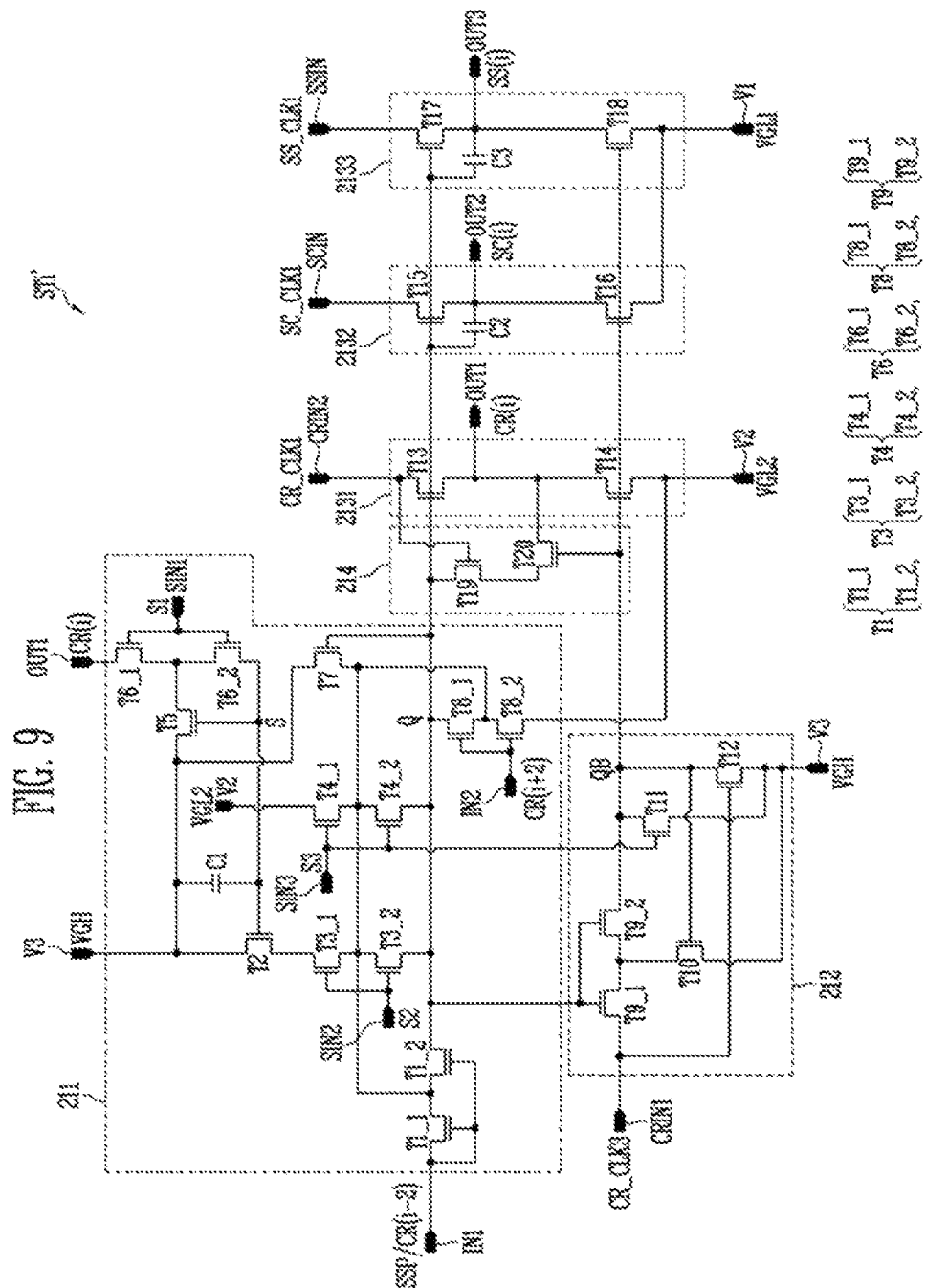
FIG. 9 is a circuit diagram according to another embodiment of the stage shown in FIG. 5.

FIG. 9 is a circuit diagram according to another embodiment of the stage shown in FIG. 5. The stage STi' shown in FIG. 9 is substantially the same as the stage STi shown in FIG. 6 except that the stage STi' shown in FIG. 9 further includes a third controller 214. Therefore, the same reference numerals are assigned to the same or similar components as those of the stage STi shown in FIG. 6 and the detailed description thereof is omitted.

Referring to FIG. 9, the stage STi' includes a third controller 214. The third controller 214 is provided to prevent an unwanted ripple phenomenon of the carry signal CR(i). The third controller 214 includes a nineteenth transistor T19 and a twentieth transistor T20.

The nineteenth transistor T19 and the twentieth transistor T20 are connected in series between the driving node Q and the first output terminal OUT1. A gate electrode of the nineteenth transistor T19 is connected to the second carry clock input terminal CRIN2, and a gate electrode of the twentieth transistor T20 is connected to the inversion driving node QB.

When the first carry clock signal CR_CLK1 is input to the second carry clock input terminal CRIN2 while the inversion driving node QB is set to the gate on voltage, the nineteenth transistor T19 and the twentieth transistor T20 transfer the second power VGL2 input from the second power input terminal V2 through the fourteenth transistor T14 to the driving node Q. That is, the nineteenth transistor T19 and the twentieth transistor T20 stably maintain the voltage of the driving node Q as the gate off voltage, thereby ensuring the turn-off state of the thirteenth transistor T13. As a result, the nineteenth transistor T19 and the twentieth transistor T20 prevent the first carry clock signal CR_CLK1 from being output as the carry signal CR(i) while the inversion driving node QB is set to the gate on voltage.

Figure 10:
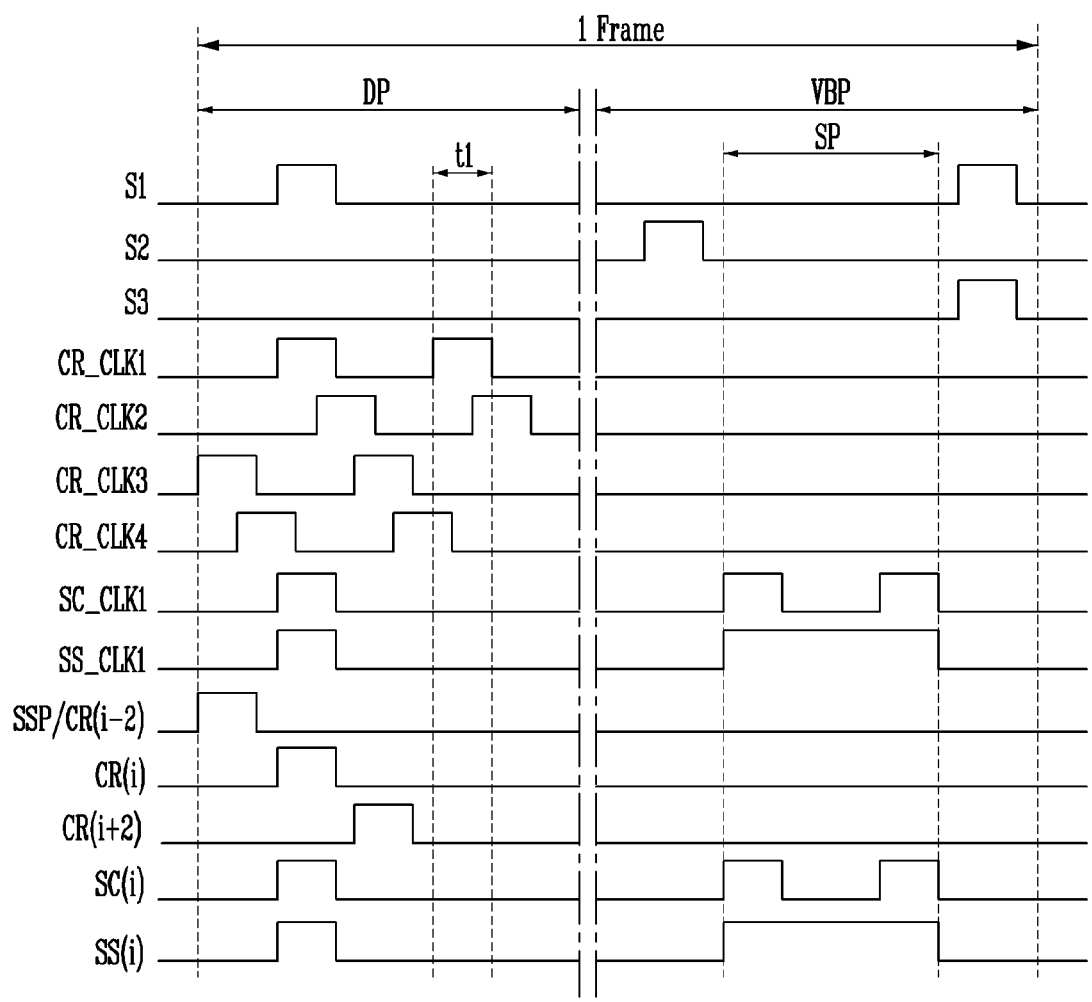
FIG. 10 is a timing diagram illustrating a method of driving the stage shown in FIG. 9.

FIG. 10 is a timing diagram illustrating a method of driving the stage shown in FIG. 9. FIG. 10 illustrates waveforms of the signals applied to the stage STi' shown in FIG. 9 and the signals output from the stage STi' during one frame period 1 Frame. The one frame period 1 Frame shown in FIG. 10 may be synchronized with the driving waveform of the pixel PX shown in FIG. 3.

The timing diagram shown in FIG. 10 is substantially the same as the timing diagram shown in FIG. 8. Hereinafter, detailed description of the operation repetitive to the timing diagram shown in FIG. 8 will be omitted, and the timing diagram will be described based on an operation of the third controller 214 of the stage ST' shown in FIG. 9.

Referring to FIG. 10, the driving node Q may be set to the low voltage that is the gate off voltage and the inversion driving node QB may be set to the high voltage that is the gate on voltage before the first period t1. When the first carry clock signal CR_CLK1 is applied during the first period t1, both of the nineteenth transistor T19 and the twentieth transistor T20 may be turned on.

Then, the second power VGL2 input to the second power input terminal V2 may be transferred to the driving node Q through the fourteenth transistor T14, the twentieth transistor T20, and the nineteenth transistor T19 of the turn-on state. The driving node Q may stably maintain the gate off voltage by the second power VGL2.

Therefore, the thirteenth transistor T13 maintains the turn-off state stably, and prevents the first carry clock signal CR_CLK1 applied to the thirteenth transistor T13 from being leaked to the first output terminal OUT1.

Figure 11:
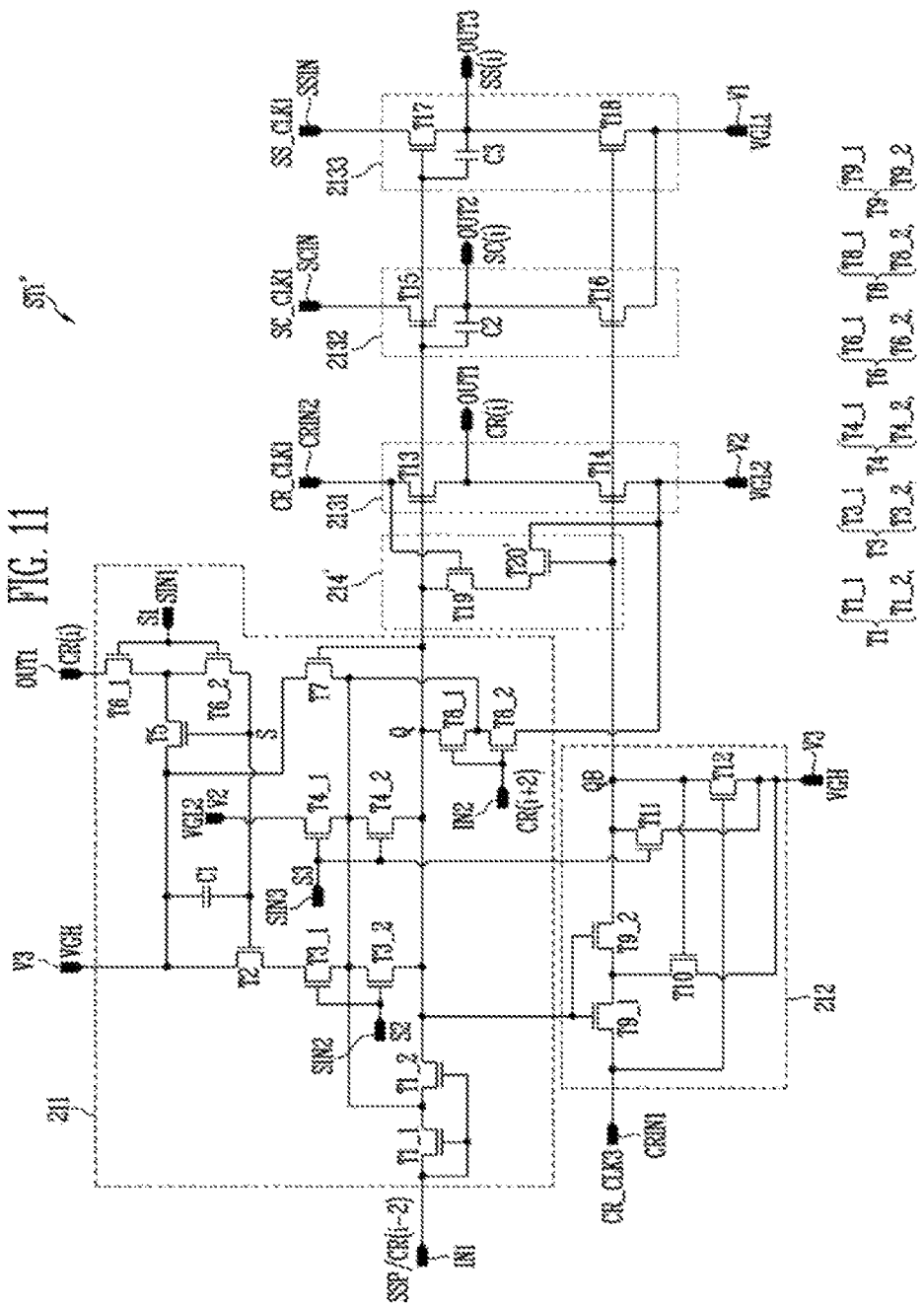
FIG. 11 is a circuit diagram according to further another embodiment of the stage shown in FIG. 5.

FIG. 11 is a circuit diagram according to further another embodiment of the stage shown in FIG. 5. The stage STi" shown in FIG. 11 is substantially the same as the stage STi' shown in FIG. 9 except for a configuration of a third controller 214'. Therefore, the same reference numerals are assigned to the same or similar components as those of the stage ST' shown in FIG. 9 and the detailed description thereof is omitted.

Referring to FIG. 11, the stage STi" includes the third controller 214'. The third controller 214' is provided to prevent an unwanted ripple phenomenon of the carry signal CR(i). The third controller 214' includes a nineteenth transistor T19' and a twentieth transistor T20'.

The nineteenth transistor T19' and the twentieth transistor T20' are connected in series between the driving node Q and the second power input terminal V2. A gate electrode of the nineteenth transistor T19' is connected to the second carry clock input terminal CRIN2, and a gate electrode of the twentieth transistor T20' is connected to the inversion driving node QB.

When the first carry clock signal CR_CLK1 is input to the second carry clock input terminal CRIN2 while the inversion driving node QB is set to the gate on voltage, the nineteenth transistor T19' and the twentieth transistor T20' transfer the second power VGL2 input from the second power input terminal V2 to the driving node Q. That is, the nineteenth transistor T19' and the twentieth transistor T20' stably maintain the voltage of the driving node Q as the gate off voltage, thereby ensuring the turn-off state of the thirteenth transistor T13. As a result, the nineteenth transistor T19' and the twentieth transistor T20' prevent the first carry clock signal CR_CLK1 from being output as the carry signal CR(i) while the inversion driving node QB is set to the gate on voltage.

The stage STi" shown in FIG. 11 may directly transfers the second power VGL2 to the driving node Q without through the fourteenth transistor T14, compared to the stage STi' shown in FIG. 9, and thus, the turn-off state of the thirteenth transistor T13 may be more stably ensured.

Figure 12:
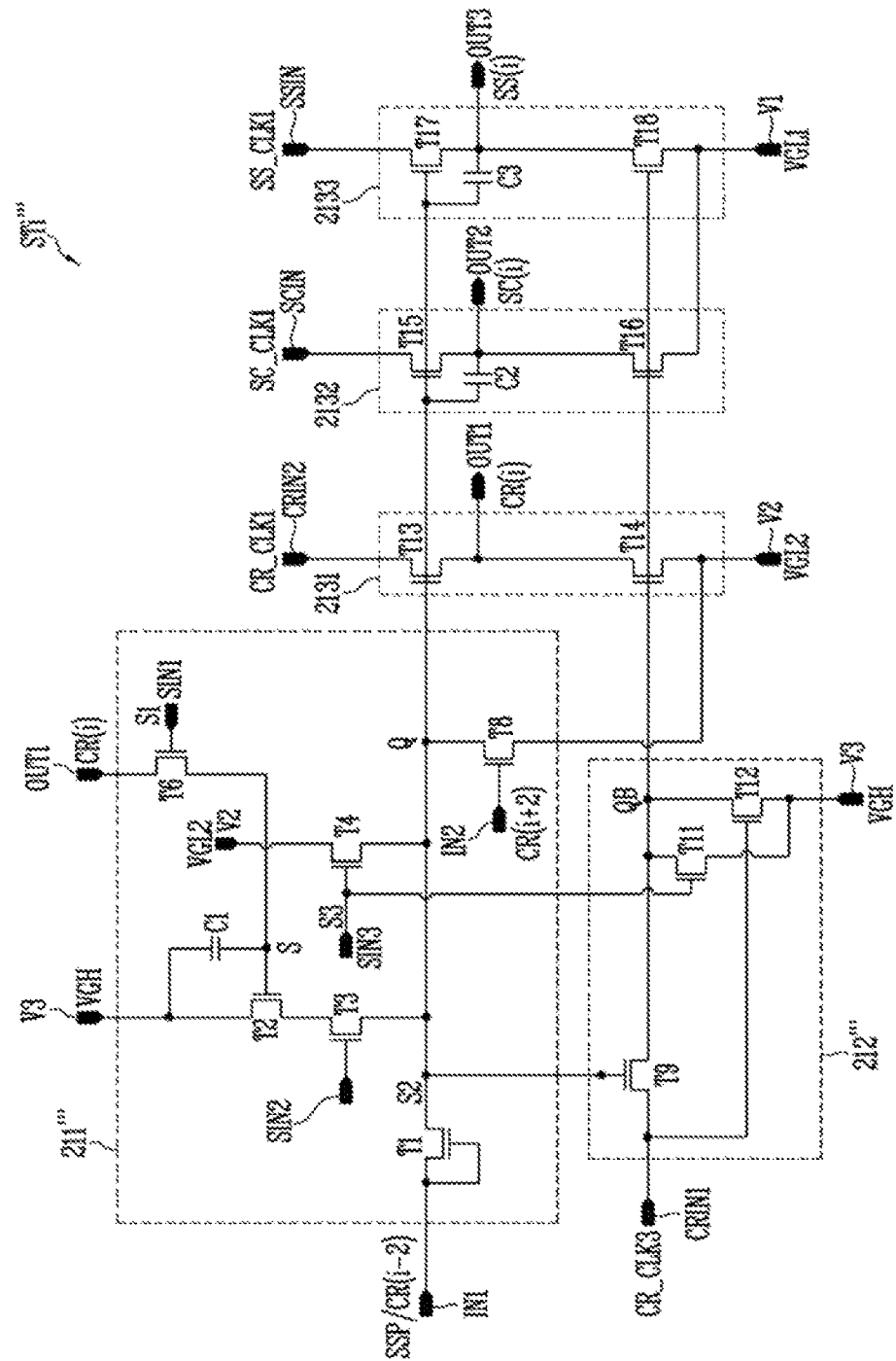
FIG. 12 is a circuit diagram according to still further another embodiment of the stage shown in FIG. 5.

FIG. 12 is a circuit diagram according to still further another embodiment of the stage shown in FIG. 5.

Referring to FIG. 12, the stage STi''' according to further another embodiment of the inventive concepts may include a first controller 211''', a second controller 212''', and first to third output buffers 2131, 2132, and 2133.

The first controller 211''' controls the voltage of the driving node Q based on input signals. The first controller 211''' includes first to fourth transistors T1 to T4, a sixth transistor T6, an eighth transistor T8, and a first capacitor C1.

The first transistor T1 may be connected between the first input terminal IN1 and the driving node Q. A gate electrode of the first transistor T1 is connected to the first input terminal IN1. When the scan start signal SSP or the carry signal CR(i−2) of the previous stage is input to the first input terminal IN1, the first transistor T1 may be turned on to transfer the scan start signal SSP or the carry signal CR(i−2) of the previous stage to the driving node Q. That is, the first transistor T1 may charge the voltage of the driving node Q to the gate on voltage in response to the scan start signal SSP or the carry signal CR(i−2) of the previous stage.

The second transistor T2 is connected between the third power input terminal V3 and the third transistor T3. A gate electrode of the second transistor T2 is connected to the sensing node S. The second transistor T2 may be turned on when the sensing node S is charged to the gate on voltage.

The third transistor T3 may be connected between the second transistor T2 and the driving node Q. A gate electrode of the third transistor T3 is connected to the second control signal input terminal SIN2. When the second control signal S2 is input to the second control signal input terminal SIN2, the third transistor T3 may be turned on to connect the second transistor T2 and the driving node Q to each other.

When the sensing node S is charged to the gate on voltage during the driving period DP, the second transistor T2 and the third transistor T3 described above may be turned on by the second control signal S2 supplied at least once during the sensing period SP to transfer the third power VGH to the driving node Q. Therefore, the driving node Q may be charged to the gate on voltage during the sensing period SP.

The fourth transistor T4 may be connected between the second power input terminal V2 and the driving node Q. A gate electrode of the fourth transistor T4 is connected to the third control signal input terminal SIN3. When the third control signal S3 is input to the second control signal input terminal SIN3, the fourth transistor T4 may be turned on to transfer the second power VGL2 to the driving node Q. That is, the fourth transistor T4 may be turned on by the third control signal S3 supplied at least once in one frame to set (reset) the voltage of the driving node Q to the gate off voltage.

The sixth transistor T6 may be connected in series between the first output terminal OUT1 and the sensing node S. A gate electrode of the sixth transistor T6 is connected to the first control signal input terminal SIN1. When the first control signal S1 is input to the first control signal input terminal SIN1, the sixth transistor T6 may be turned on to supply the carry signal CR(i) output from a corresponding stage STi to the sensing node S. That is, when the first control signal S1 is selectively applied to the stage STi in synchronization with the output of the carry signal CR(i) during the driving period DP, the sixth transistor T6 may be turned on to charge the voltage of the sensing node S to the gate on voltage of the carry signal CR(i).

The eighth transistor T8 is connected between the driving node Q and the second power input terminal V2. A gate electrode of the eighth transistor T8 is connected to the second input terminal IN2. When the carry signal CR(i+2) of the subsequent stage is input to the second input terminal IN2, the eighth transistor T8 may be turned on to apply the second power VGL2 input to the second power input terminal V2, to the driving node Q. That is, when the carry signal CR(i+2) of the subsequently stage is applied to the second input terminal IN2, the eighth transistor T8 may be turned on to discharge the voltage of the driving node Q to a voltage of the second power VGL2, that is, the gate off voltage.

The first capacitor C1 is connected between the third power input terminal V3 and the sensing node S.

The second controller 212" controls the voltage of the inversion driving node QB based on input signals. The second controller 212" includes a ninth transistor T9, an eleventh transistor T11, and a twelfth transistor T12.

The ninth transistor T9 is connected between the first carry clock input terminal CRIN1 and the inversion driving node QB. A gate electrode of the ninth transistor T9 is connected to the driving node Q. When the driving node Q is set to the gate on voltage, the ninth transistor T9 may be turned on to apply the third carry clock signal CR_CLK3 input to the first carry clock input terminal CRIN1, to the inversion driving node QB. That is, while the ninth transistor T9 is turned on, the ninth transistor T9 may trigger the voltage of the inversion driving node QB between the gate on voltage and the gate off voltage in correspondence with the third carry clock signal CR_CLK3 input to the first carry clock input terminal CRIN1.

The eleventh transistor T11 is connected between the inversion driving node QB and the third power input terminal V3. A gate electrode of the eleventh transistor T11 is connected to the third control signal input terminal SIN3. When the third control signal S3 is input to the third control signal input terminal SIN3, the eleventh transistor T11 may be turned on to apply the third power VGH input to the third power input terminal V3, to the inversion driving node QB. That is, the eleventh transistor T11 may be turned on by the third control signal S3 supplied at least once in one frame to set (for example, reset) the voltage of the inversion driving node QB to the voltage of the third power VGH, that is, the gate on voltage.

The twelfth transistor T12 is connected between the inversion driving node QB and the third power input terminal V3. A gate electrode of the twelfth transistor T12 is connected to the first carry clock input terminal CRIN1. When the third carry clock signal CR_CLK3 of the gate on voltage is input to the first carry clock input terminal CRIN1, the twelfth transistor T12 may be turned on to apply the third power VGH input to the third power input terminal V3, to the inversion driving node QB. That is, when the third carry clock signal CR_CLK3 is input to the first carry clock input terminal CRIN1, the twelfth transistor T12 may be turned on to charge the voltage of the inversion driving node QB to the voltage of the third power VGH, that is, the gate on voltage.

The first output buffer 2131 may control the output of the carry signal CR(i) in correspondence with the voltage of the driving node Q and the voltage of the inversion driving node QB.

The first output buffer 2131 may control the output of the carry signal CR(i) in correspondence with the voltage of the driving node Q and the voltage of the inversion driving node QB. The first output buffer 2131 may include a thirteenth transistor T13 and a fourteenth transistor T14.

The thirteenth transistor T13 is connected between the second carry clock input terminal CRIN2 and the first output terminal OUT1. A gate electrode of the thirteenth transistor T13 is connected to the driving node Q. When the driving node Q is set to the gate on voltage, the thirteenth transistor T13 may be turned on to output the first carry clock signal CR_CLK1 input to the second carry clock input terminal CRIN2 to the first output terminal OUT1.

The fourteenth transistor T14 is connected between the first output terminal OUT1 and the second power input terminal V2. A gate electrode of the fourteenth transistor T14 is connected to the inversion driving node QB. When the inversion driving node QB is set to the gate on voltage, the fourteenth transistor T14 may be turned on to output the second power VGL2 input to the second power input terminal V2 to the first output terminal OUT1.

The first carry clock signal CR_CLK1 or the second power VGL2 output to the first output terminal OUT1 through the thirteenth transistor T13 or the fourteenth transistor T14 may be used as the carry signal CR(i).

Meanwhile, in various embodiments, the fourteenth transistor T14 may be connected to the first power input terminal V1 instead of the second power input terminal V2. In such an embodiment, the first power VGL1 input to the first power input terminal V1 may be output as the carry signal CR(i).

The second output buffer 2132 may control the output of the scan signal SC(i) in correspondence with the voltage of the driving node Q and the voltage of the inversion driving node QB. The second output buffer 2132 may include a fifteenth transistor T15, a sixteenth transistor T16, and a second capacitor C2.

The fifteenth transistor T15 is connected between the scan clock input terminal SCIN and the second output terminal OUT2. A gate electrode of the fifteenth transistor T15 is connected to the driving node Q. When the driving node Q is set to the gate on voltage, the fifteenth transistor T15 may be turned on to output the first scan clock signal SC_CLK1 input to the scan clock input terminal SCIN to the second output terminal OUT2.

The sixteenth transistor T16 is connected between the second output terminal OUT2 and the first power input terminal V1. A gate electrode of the sixteenth transistor T16 is connected to the inversion driving node QB. When the inversion driving node QB is set to the gate on voltage, the sixteenth transistor T16 may be turned on to output the first power VGL1 input to the first power input terminal V1 to the second output terminal OUT2.

The first scan clock signal SC_CLK1 or the first power VGL1 output to the second output terminal OUT2 through the fifteenth transistor T15 or the sixteenth transistor T16 may be used as the scan signal SC(i).

The second capacitor C2 is connected between the driving node Q and the second output terminal OUT2. The second capacitor C2 may enable the fifteenth transistor T15 to be more robust to a threshold voltage negative condition by coupling between the gate electrode and one electrode (for example, a drain electrode) of the fifteenth transistor T15.

Meanwhile, in various embodiments, the sixteenth transistor T16 may be connected to the second power input terminal V2 instead of the first power input terminal V1. In such an embodiment, the second power VGL2 input to the second power input terminal V2 may be output as the scan signal SC(i).

In addition, in various embodiments, the second capacitor C2 may be omitted.

The third output buffer 2133 may control the output of the sensing signal SS(i) in correspondence with the voltage of the driving node Q and the voltage of the inversion driving node QB. The third output buffer 2133 may include a seventeenth transistor T17, an eighteenth transistor T18, and a third capacitor C3.

The seventeenth transistor T17 is connected between the sensing clock input terminal SSIN and the third output terminal OUT3. A gate electrode of the seventeenth transistor T17 is connected to the driving node Q. When the driving node Q is set to the gate on voltage, the seventeenth transistor T17 may be turned on to output the first sensing clock signal SS_CLK1 input to the sensing clock input terminal SSIN, to the third output terminal OUT3.

The eighteenth transistor T18 is connected between the third output terminal OUT3 and the first power input terminal V1. A gate electrode of the eighteenth transistor T18 is connected to the inversion driving node QB. When the inversion driving node QB is set to the gate on voltage, the eighteenth transistor T18 may be turned on to output the first power VGL1 input to the first power input terminal V1, to the third output terminal OUT3.

The first sensing clock signal SS_CLK1 or the first power VGL1 output to the third output terminal OUT3 through the seventeenth transistor T17 or the eighteenth transistor T18 may be used as the sensing signal SS(i).

The third capacitor C3 is connected between the driving node Q and the third output terminal OUT3. The third capacitor C3 may enable the seventeenth transistor T17 to be more robust to a threshold voltage negative condition by coupling between the gate electrode and one electrode (for example, a drain electrode) of the seventeenth transistor T17.

Meanwhile, in various embodiments, the eighteenth transistor T18 may be connected to the second power input terminal V2 instead of the first power input terminal V1. In such an embodiment, the second power VGL2 input to the second power input terminal V2 may be output as the sensing signal SS(i).

In addition, in various embodiments, the third capacitor C3 may be omitted.

The driving method of the stage STi''' shown in FIG. 12 is substantially the same as that shown in FIG. 8. Therefore, the detailed description of the driving method is omitted.

Some of the advantages that may be achieved by exemplary embodiments of the invention include elimination of an inverter, and thus, elimination a transistor that is required to be always maintained in a turned-on state. Therefore, constant current occurrence may be prevented and power consumption may be reduced. In addition, the stage and the scan driver having the same according to the exemplary embodiments of invention do not require a dummy circuit required in a circuit in which an inverter is provided, thereby increasing space utilization efficiency. Further, the stage and the scan driver having the same according to the exemplary embodiments of the invention may reduce a size and a manufacturing cost by minimizing the number of transistors and capacitances.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A stage that outputs a scan signal and a sensing signal to a scan line and a sensing line, respectively, the stage comprising:
    a first controller configured to control a voltage of a sensing node and a voltage of a driving node based on a first control signal, a second control signal, a third control signal, a carry signal of the stage, and a carry signal of another stage connected to the stage;
    a second controller configured to control a voltage of an inversion driving node based on a first carry clock signal, the voltage of the driving node, and the third control signal;
    a first output buffer configured to output a second carry clock signal or a second low potential power as the carry signal in correspondence with the voltage of the driving node and the voltage of the inversion driving node;
    a second output buffer configured to output a scan clock signal or a first low potential power as the scan signal in correspondence with the voltage of the driving node and the inversion driving node; and
    a third output buffer configured to output a sensing clock signal or the first low potential power as the sensing signal in correspondence with the voltage of the driving node and the voltage of the inversion driving node,
    wherein the second controller comprises:
    a ninth transistor connected between a first carry clock input terminal receiving the first carry clock signal and the inversion driving node, and having a gate electrode connected to the driving node;
    an eleventh transistor connected between the inversion driving node and a third power input terminal receiving high potential power, and having a gate electrode connected to a third control signal input terminal receiving the third control signal; and a twelfth transistor connected between the inversion driving node and the third power input terminal, and having a gate electrode connected to the first carry clock input terminal.

2. The stage according to claim 1, wherein, when the driving node is set to a gate on voltage, the ninth transistor is turned on to transfer the first carry clock signal to the inversion driving node.

3. The stage according to claim 1, wherein, when the third control signal is input, the eleventh transistor is turned on to transfer the high potential power to the inversion driving node, and the inversion driving node is set to a gate on voltage of the high potential power.

4. The stage according to claim 1, wherein, when the first carry clock signal is input, the twelfth transistor is turned on to transfer the high potential power to the inversion driving node, and the inversion driving node is set to a gate on voltage of the high potential power.

5. The stage according to claim 1, wherein the ninth transistor comprises a (9_1)-th transistor and a (9_2)-th transistor connected in series between the first carry clock input terminal and the inversion driving node, and having a gate electrode connected to the driving node, and the stage further comprises a tenth transistor connected between a common node of the (9_1)-th transistor and the (9_2)-th transistor and the third power input terminal, and having a gate electrode connected to the inversion driving node.

6. A scan driver comprising stages that each output a scan signal and a sensing signal to a respective scan line and sensing line, wherein each of the stages comprises the stage according to claim 1.

7. A stage that outputs a scan signal and a sensing signal to a scan line and a sensing line, respectively, the stage comprising:

a first controller configured to control a voltage of a sensing node and a voltage of a driving node based on a first control signal, a second control signal, a third control signal, a carry signal of the stage, and a carry signal of another stage connected to the stage;

a second controller configured to control a voltage of an inversion driving node based on a first carry clock signal, the voltage of the driving node, and the third control signal;

a first output buffer configured to output a second carry clock signal or a second low potential power as the carry signal in correspondence with the voltage of the driving node and the voltage of the inversion driving node;

a second output buffer configured to output a scan clock signal or a first low potential power as the scan signal in correspondence with the voltage of the driving node and the inversion driving node; and a third output buffer configured to output a sensing clock signal or the first low potential power as the sensing signal in correspondence with the voltage of the driving node and the voltage of the inversion driving node, wherein the first controller comprises:

a first transistor connected between a first input terminal receiving a scan start signal or a carry signal of a previous stage connected to the stage and the driving node, and having a gate electrode connected to the first input terminal;

a second transistor and a third transistor connected in series between a third power input terminal receiving high potential power and the driving node, and having gate electrodes connected to the sensing node and a second control signal input terminal receiving the second control signal, respectively;

a fourth transistor connected between the second power input terminal receiving the first low potential power and the driving node, and having a gate electrode connected to a third control signal input terminal receiving the third control signal;

a sixth transistor connected between a first output terminal outputting the carry signal and the sensing node, and having a gate electrode connected to a first control signal input terminal receiving the first control signal;

an eighth transistor connected between the driving node and a second power input terminal receiving the second low potential power, and having a gate electrode receiving a carry signal of a next stage connected to the stage; and a first capacitor connected between the third power input terminal and the sensing node.

8. The stage according to claim 7, wherein, when the scan start signal or the carry signal of the previous stage is input, the first transistor is turned on to transfer the scan start signal or the carry signal of the previous stage to the driving node, and the driving node is set to a gate on voltage by the scan start signal or the carry signal of the previous stage.

9. The stage according to claim 7, wherein, when the third control signal is input, the fourth transistor is turned on to transfer the second low potential power to the driving node, and the driving node is set to a gate off voltage by the first low potential power.

10. The stage according to claim 7, wherein, when the first control signal is input during a driving period in one frame, the sixth transistor is turned on to transfer the carry signal to the sensing node, the sensing node is set to a gate on voltage by the carry signal, and the second transistor is turned on as the sensing node is set to the gate on voltage.

11. The stage according to claim 10, wherein, when the second control signal is input during a sensing period in the one frame, the third transistor is turned on to transfer the high potential power transferred through the second transistor to the driving node, and the driving node is set to a gate on voltage by the high potential power.

12. The stage according to claim 7, wherein, when the carry signal of the next stage is input during a driving period in one frame, the eighth transistor is turned on to transfer the second low potential power to the driving node, and the driving node is set to a gate off voltage by the second low potential power.

13. The stage according to claim 7, wherein the first transistor comprises:

a (1_1)-th transistor and a (1_2)-th transistor connected in series between the first input terminal and the driving node, and having a gate electrode connected to the first input terminal;

the third transistor comprises:

a (3_1)-th transistor and a (3_2)-th transistor connected in series between the second transistor and the driving node, and having a gate electrode connected to the second control signal input terminal;

the fourth transistor comprises:

a (4_1)-th transistor and a (4_2)-th transistor connected in series between the second power input terminal and the driving node, and having a gate electrode connected to the third control signal input terminal;

the sixth transistor comprises:

a (6_1)-th transistor and a (6_2)-th transistor connected in series between the first output terminal and the sensing node, and having a gate electrode connected to the first control signal input terminal, and the eighth transistor comprises:

an (8_1)-th transistor and an (8_2)-th transistor connected in series between the driving node and the second power input terminal, and having a gate electrode receiving the carry signal of the next stage through.

14. The stage according to claim 13, wherein the first controller comprises:

a fifth transistor connected between a common node of the (6_1)-th transistor and the (6_2)-th transistor and the third power input terminal, and having a gate electrode connected to the sensing node; and a seventh transistor having one electrode connected to the third power input terminal, the other electrode connected to a common node of the (1_1)-th transistor and the (1_2)-th transistor, a common node of the (3_1)-th transistor and the (3_2)-th transistor, a common node of the (4_1)-th transistor and the (4_2)-th transistor, and a common node of the (8_1)-th transistor and the (8_2)-th transistor, and a gate electrode connected to the driving node.

15. A scan driver comprising stages that each output a scan signal and a sensing signal to a respective scan line and sensing line, wherein each of the stages comprises the stage according to claim 7.

16. A stage that outputs a scan signal and a sensing signal to a scan line and a sensing line, respectively, the stage comprising:

a first controller configured to control a voltage of a sensing node and a voltage of a driving node based on a first control signal, a second control signal, a third control signal, a carry signal of the stage, and a carry signal of another stage connected to the stage;

a second controller configured to control a voltage of an inversion driving node based on a first carry clock signal, the voltage of the driving node, and the third control signal;

a first output buffer configured to output a second carry clock signal or a second low potential power as the carry signal in correspondence with the voltage of the driving node and the voltage of the inversion driving node;

a second output buffer configured to output a scan clock signal or a first low potential power as the scan signal in correspondence with the voltage of the driving node and the inversion driving node;

a third output buffer configured to output a sensing clock signal or the first low potential power as the sensing signal in correspondence with the voltage of the driving node and the voltage of the inversion driving node; and a third controller configured to transfer the second low potential power to the driving node when the second carry clock signal is input while the inversion driving node is set to a gate on voltage.

17. The stage according to claim 16, wherein the third controller comprises a nineteenth transistor and a twentieth transistor connected in series between the driving node and a first output terminal outputting the carry signal, and having gate electrodes connected to a second carry clock input terminal receiving the second carry clock signal and the inversion driving node, respectively.

18. The stage according to claim 16, wherein the third controller comprises a nineteenth transistor and a twentieth transistor connected in series between the driving node and a second power input terminal receiving the second low potential power, and having gate electrodes connected to a second carry clock input terminal receiving the second carry clock signal and the inversion driving node, respectively.

19. A scan driver comprising stages that each output a scan signal and a sensing signal to a respective scan line and sensing line, wherein each of the stages comprises the stage according to claim 16.

* * * * *